US009837416B2

(12) United States Patent
Walke et al.

(10) Patent No.: US 9,837,416 B2
(45) Date of Patent: Dec. 5, 2017

(54) MULTI-THRESHOLD VOLTAGE FIELD EFFECT TRANSISTOR AND MANUFACTURING METHOD THEREOF

(71) Applicant: TAIWAN SEMICONDUCTOR MANUFACTURING COMPANY LTD., Hsinchu (TW)

(72) Inventors: Amey Mahadev Walke, Hsinchu (TW); Chi-Hsun Hsieh, Taichung (TW); Che-Min Chu, Taipei County (TW); Yu-Hsuan Kuo, Taipei (TW)

(73) Assignee: Taiwan Semiconductor Manufacturing Company Ltd., Hsin-Chu (TW)

( * ) Notice: Subject to any disclaimer, the term of this patent is extended or adjusted under 35 U.S.C. 154(b) by 0 days.

(21) Appl. No.: 14/815,626

(22) Filed: Jul. 31, 2015

(65) Prior Publication Data
US 2017/0033106 A1 Feb. 2, 2017

(51) Int. Cl.
*H01L 21/70* (2006.01)
*H01L 27/092* (2006.01)
(Continued)

(52) U.S. Cl.
CPC .. *H01L 27/0924* (2013.01); *H01L 21/823807* (2013.01); *H01L 21/823821* (2013.01);
(Continued)

(58) Field of Classification Search
CPC ..... H01L 21/823807; H01L 21/823842; H01L 27/092; H01L 29/4966; H01L 27/0922;
(Continued)

(56) References Cited

U.S. PATENT DOCUMENTS 5,952,701 A * 9/1999 Bulucea ................ H01L 27/092
257/369
2006/0267895 A1* 11/2006 Yanase ................ H01L 27/1237
345/92
(Continued)

FOREIGN PATENT DOCUMENTS

KR 10-1999-0023638 3/1999
KR 10-2015-0082086 7/2015

OTHER PUBLICATIONS

Office Action dated Apr. 29, 2016 on the Germany related application 10 2015 113 081.5.
(Continued)

*Primary Examiner* — Thao X Le
*Assistant Examiner* — Nduka Ojeh
(74) *Attorney, Agent, or Firm* — Haynes and Boone, LLP

(57) ABSTRACT

The present disclosure provides an FET structure including a transistor of a first conductive type. The transistor includes a substrate having a region of a second conductive type, a channel between source and drain, and a gate over the channel. The channel includes dopants of the first conductive type. The gate includes a work function setting layer of the second conductive type. The present disclosure also provides a method for manufacturing an FET with multi-threshold voltages scheme. The method includes exposing channels of a first transistor of a first conductive type and a first transistor of a second conductive type from a first mask, doping the channels with dopants of the first conductive type, exposing channels of a second transistor of the first conductive type and a second conductive type from a second mask, and doping the channels with dopants of the second conductive type.

20 Claims, 21 Drawing Sheets

(51) Int. Cl.
  *H01L 21/8238* (2006.01)
  *H01L 29/10* (2006.01)
  *H01L 27/12* (2006.01)
  *H01L 21/8234* (2006.01)

(52) U.S. Cl.
  CPC .. *H01L 21/823842* (2013.01); *H01L 27/1203* (2013.01); *H01L 29/1054* (2013.01); *H01L 21/82345* (2013.01)

(58) Field of Classification Search
  CPC ......... H01L 21/823821; H01L 27/0924; H01L 29/1054; H01L 29/66537; H01L 29/783
  USPC .......... 257/E21.633, E21.637, 369, E27.062, 257/403, 204; 438/217, 154, 199, 275, 438/276, 174, 289
  See application file for complete search history.

(56) References Cited

U.S. PATENT DOCUMENTS

| | | | | |
|---|---|---|---|---|
| 2007/0187797 | A1* | 8/2007 | Kato | H01L 21/823807 257/500 |
| 2009/0124069 | A1* | 5/2009 | Clark, Jr. | H01L 21/26586 438/525 |
| 2013/0056795 | A1 | 3/2013 | Wu et al. | |
| 2013/0069164 | A1 | 3/2013 | Marino et al. | |
| 2014/0312423 | A1* | 10/2014 | Cheng | H01L 21/823807 257/351 |
| 2015/0021698 | A1* | 1/2015 | Ando | H01L 21/823807 257/368 |
| 2015/0194423 | A1 | 7/2015 | Wang et al. | |
| 2015/0200205 | A1 | 7/2015 | Cheng et al. | |
| 2015/0206953 | A1 | 7/2015 | Basker et al. | |
| 2015/0243652 | A1* | 8/2015 | Joshi | H01L 27/088 257/392 |

OTHER PUBLICATIONS

English Translation of a Korean Patent Office Action for Patent No. 10-2015-0153198.

Foreign Document in Korean Language Upper Right Hand Corner No. 10-2015-0082086.

Foreign Document in Korean Language Upper Right Hand Corner No. 1999-023638.

English Translation of the Korean Office Action Titled Materials for Information Disclosure Statement.

* cited by examiner

| VT Scheme | NMOS | | | | PMOS | | | |
|---|---|---|---|---|---|---|---|---|
| | uLVT | LVT | SVT | HVT | uLVT | LVT | SVT | HVT |
| WF-1 | V | | | | | | V | V |
| WF-2 | | | V | V | V | V | | |
| N-IMP | | | V | | | V | | |
| P-IMP | | V | | | | | V | |

MULTI-THRESHOLD VOLTAGE FIELD EFFECT TRANSISTOR AND MANUFACTURING METHOD THEREOF

FIELD

The present disclosure relates to a field effect transistor (FET) structure including multi-threshold voltage ($V_t$) transistors and method of manufacturing the FET structure.

BACKGROUND

Multi-threshold voltage IC devices are often utilized in the semiconductor integrated circuit (IC) industry to optimize delay or power. A multi-threshold voltage IC device may include several different devices, each having a different threshold voltage (i.e., operating voltage). For example, the multi-threshold voltage IC device may include a low threshold voltage device and a high threshold voltage device. One approach to achieving the different threshold voltage devices includes channel and halo implantation optimization. This implements heavy implantations to achieve the higher threshold voltage devices, and separate masks for each desired threshold voltage. It has been observed that the heavier implantation processes can cause mobility degradation and junction leakage current, and using a separate mask for each desired threshold voltage incurs unnecessary cost. For example, band-to-band tunneling current is high under heavy implantation such that the OFF current is increased. Carrier mobility degradation decreases the ON current.

Another approach, which has been used in conjunction with the channel/halo implantation optimization, includes enlarging a channel length of the higher threshold voltage devices. However, as technology nodes continue to decrease, functional density (i.e., the number of interconnected devices per chip area) has generally increased while geometry size (i.e., the smallest component (or line) that can be created using a fabrication process) has decreased. Enlarging channel lengths to accommodate higher threshold voltage devices thus consumes valuable IC device space, limiting the amount of devices that can be fabricated on a single chip. Furthermore, longer channel length reduces the ON current as well as increases capacitance, hence reducing the speed of device operation.

Accordingly, although existing approaches for fabricating multi-threshold voltage devices have been generally adequate for their intended purposes, they have not been entirely satisfactory in all respects

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 5 is a spread table of the conductive type for threshold voltage implantation and conductive type of work function setting layer for a multiple threshold voltage (Vt) FET structure, according to some embodiments of the present disclosure;

DETAILED DESCRIPTION OF THE INVENTION

Figure 1:
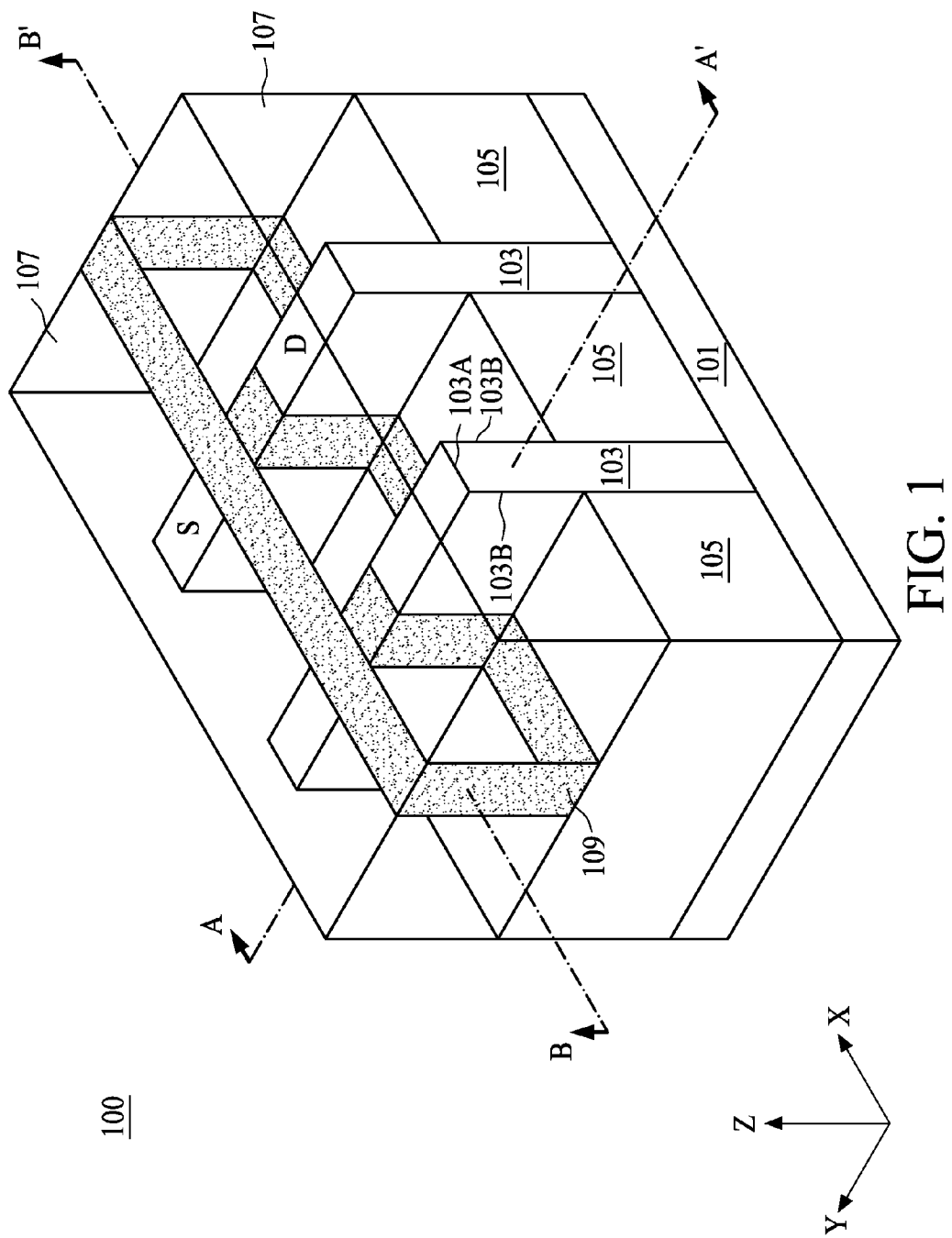
FIG. 1 is a perspective view of a FinFET structure according to some embodiments of the present disclosure.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Current methods for fabricating devices having different threshold voltage characteristics utilize channel and halo implantation optimization alone or in combination with enlarging a channel (or gate) length of the devices. For example, high threshold voltage device is achieved by heavily implanting the device channel/halo pockets and enlarging its gate length, and therefore channel length. The heavier implantation processes can cause junction leakage and/or mobility degradation. As device technology nodes are continually scaled down, enlarging the device's gate/channel length consumes valuable device area. Further, the current methods are costly, which can arise from using a separate mask for the channel/halo implantations of each device having a different threshold voltage characteristic.

On top of the above, particularly, doping (e.g., ion implantation and a thermal anneal) for threshold voltage tuning is generally ineffective in a thin-body FET (e.g., FinFET, nanowire FET, FET on fully depletion SOI), which increases the difficulty of obtaining a decent multiple threshold voltage FET structure in thin-body FET setting.

Multiple threshold voltages ($V_T$) are necessary to achieve a better power efficiency in integrated circuits. Conventionally, multiple threshold voltage FET structures are typically implemented by using two or more metal gates and two to four threshold voltage implants. Entire process requires several masks, lithography and deposition, etch and implantation steps which increases the cost of, for example, a final thin-body FET product. In addition, ultra low power (ULP) applications for Internet of Things (IOT) market demands a very low cost of production. Therefore, in the present disclosure, an efficient implementation of multiple threshold voltage scheme using only two metal gates and two threshold implants is presented. The multiple threshold voltage FET in the present disclosure is advantageous in terms of reducing the cost of the thin-body FET technology.

The present disclosure provides a multiple $V_T$ structure including an ultra low $V_T$ (uLVT) transistor, a low $V_T$ (LVT) transistor, a standard $V_T$ (SVT) transistor, and a high $V_T$ (HVT) transistor in a first conductive type and a second conductive type, respectively, and the manufacturing method of the multiple $V_T$ structure. Only two work function setting layer and two threshold voltage implantations are used to implement the aforesaid uLVT, LVT, SVT, and HVT transistors in the first and second conductive types. Alternatively stated, a total of 8 transistors with different threshold voltages can be formed using two work function material deposition and two implant operations.

The multiple $V_T$ structure of the present disclosure also provides that the uLVT and HVT transistors without any threshold implantation and hence benefit from a higher carrier mobility due to reduced impurity scattering. This in turn offers better ON current and hence better ON/OFF current ratio. Less trap generation due to implant damage can be achieved in the uLVT and HVT transistors disclosed herein, consequently, reduced trap-assisted tunneling and band to band tunneling (BTBT) current can be obtained. A very low value, for example, less than 1 nA/µm, of gate induced drain leakage (GIDL) current, lower drain to substrate BTBT current, and low OFF current can also be obtained in the uLVT and HVT transistors disclosed herein.

Figure 2B:
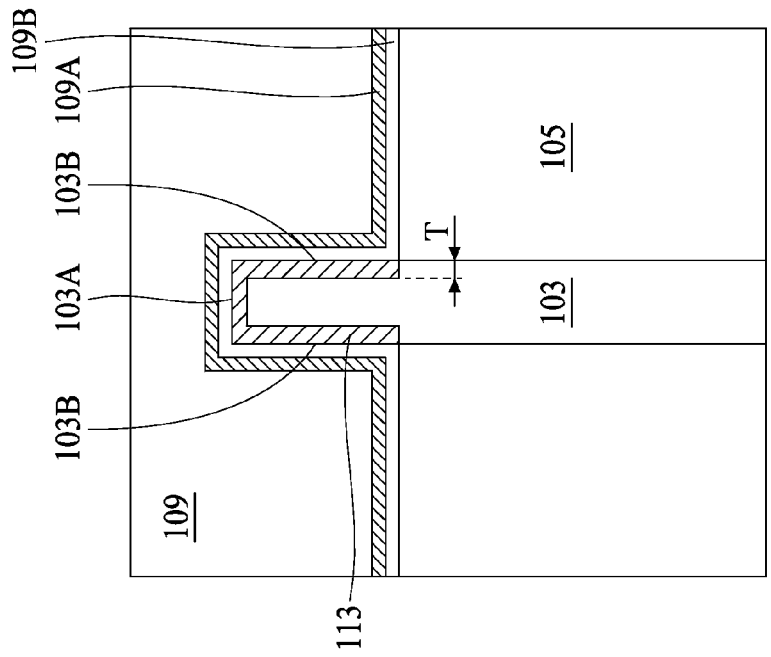
FIG. 2B is a cross sectional view of a FinFET structure along line BB' in FIG. 1, according to some embodiments of the present disclosure.
Figure 2A:
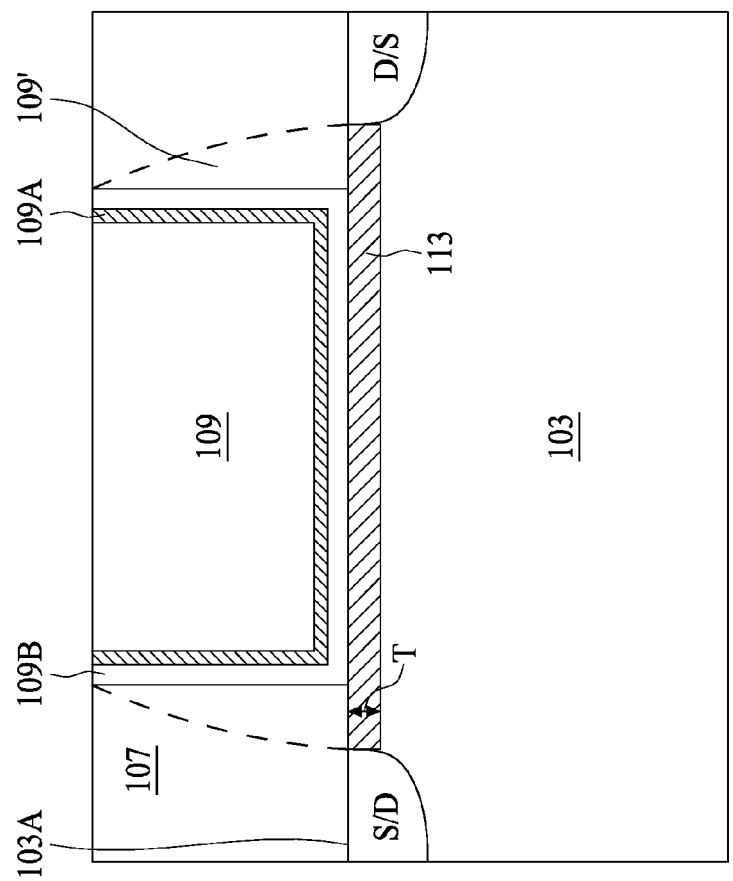
FIG. 2A is a cross sectional view of a FinFET structure along line AA' in FIG. 1, according to some embodiments of the present disclosure.
Figure 3B:
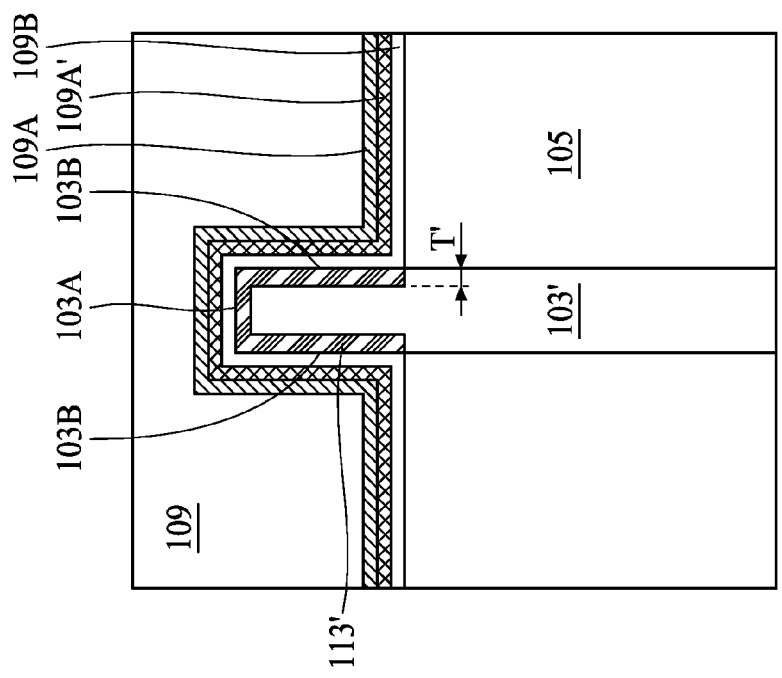
FIG. 3B is a cross sectional view of a FinFET structure along line BB' in FIG. 1, according to some embodiments of the present disclosure.
Figure 3A:
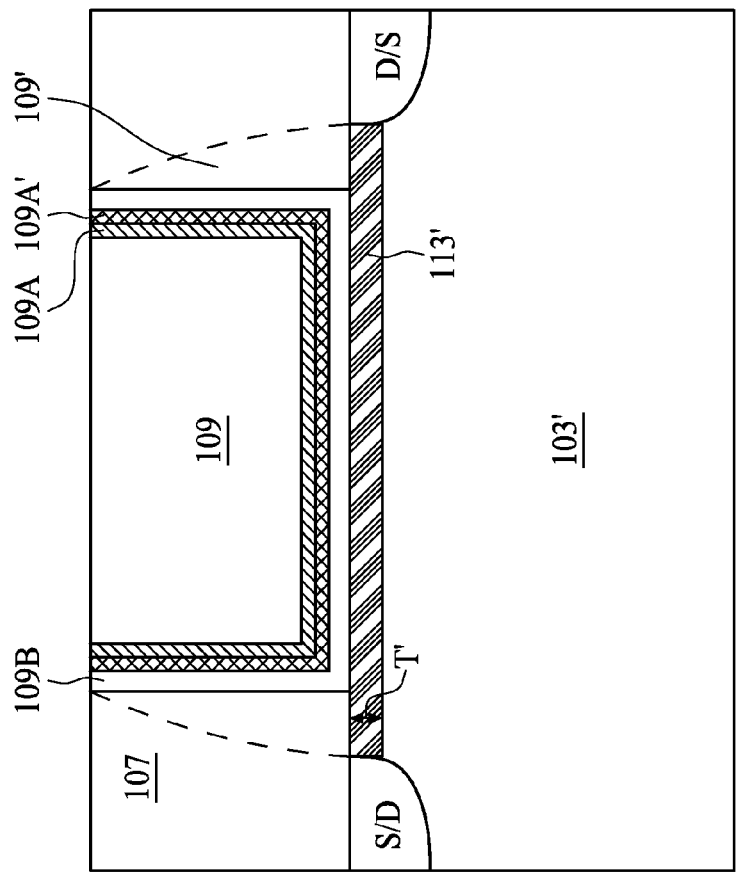
FIG. 3A is a cross sectional view of a FinFET structure along line AA' in FIG. 1, according to some embodiments of the present disclosure.

Referring to FIG. 1, a perspective view of a metal gate (MG) FinFET structure 100 is shown. Two semiconductor fins 103 are positioned on a substrate 101 and are separated by shallow trench isolation 105. Semiconductor fin 103 may be formed of silicon, silicon-germanium, germanium, or other suitable semiconductor materials. A metal gate 109 is over a top surface 103A and a sidewall 103B of the semiconductor fins 103. A channel of a transistor (not shown) is defined along the top surface 103A and the sidewall 103B of the semiconductor fin and extended between a source (S) and a drain (D) in the semiconductor fin 103. In FIG. 1, the semiconductor fin 103 extends along a Y direction, whereas the gate 109 extends along the X direction. In the subsequent figures, cross sections along line AA' and line BB' are shown. Line AA' dissects along the semiconductor fin 103 and being orthogonal to the metal gate 109 disposed thereon, hence, the source/drain (partially) in the semiconductor fin 103 and a cross section of a portion of the metal gate 109 over the top surface 103A can be observed, as shown in FIG. 2A and FIG. 3A. Line BB' dissects along the metal gate 109 and being orthogonal to the semiconductor fin 103, therefore, a cross section of the semiconductor fin 103 and a wrap-around feature of the metal gate 109 can be observed, as shown in FIG. 2B and FIG. 3B. ILD 107 is disposed over the top surface 103A and the sidewall 103B at the source (S) and the drain (D) portion of the semiconductor fins 103.

In the present embodiment, the substrate 101 is a p-type semiconductor substrate (P-Substrate) or an n-type semiconductor substrate (N-Substrate) comprising silicon. Alternatively, the substrate 101 comprises another elementary semiconductor, such as Ge, SiGe, SiGeSn, SiC, GeSn, or the like; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 101 is a semiconductor on insulator (SOI). In other alternatives, semiconductor substrate 101 may include a doped epi layer, a gradient semiconductor layer, and/or a semiconductor layer overlying another semiconductor layer of a different type, such as a silicon layer on a silicon germanium layer. The substrate 101 may include doped regions, such as a p-well, an n-well, or combination thereof.

The ILD 107 may be formed over the substrate 101. The ILD 107 includes a dielectric material, such as silicon oxide, silicon nitride, silicon oxynitride, TEOS formed oxide, phosphosilicate glass (PSG), borophosphosilicate glass (BPS G), low-k dielectric materials, other suitable dielectric materials, and/or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. The ILD layer can include a multilayer structure having multiple dielectric materials.

Referring to FIG. 2A and FIG. 2B, two cross sectional views of a MG FinFET structure are shown. Relations of the cross sections shown in FIG. 2A and FIG. 2B with the perspective view in FIG. 1 are addressed in previous paragraph and is not repeated here. Elements with the same numeral labels in FIGS. 2A, 2B and those in FIG. 1 are directed to the same structure of materials, and are not repeated here for simplicity. FIGS. 2A and 2B show a FinFET with a tuned threshold voltage by adjusting channel implant and work function setting layer. A channel length is defined along the top surface 103A of the semiconductor fin 103 and extended between a source (S) and a drain (D) in the semiconductor fin 103. The FinFET in FIGS. 2A and 2B is a transistor of a first conductive type. The semiconductor fin 103 is formed by etching a bulk semiconductor substrate 101, and having a second conductive type. Regardless of the conductive type of the bulk semiconductor substrate 101, a region of an opposite conductive type can be formed by, for example, a well implant operation. In some embodiments as shown in FIGS. 2A and 2B, the semiconductor fin 103 possesses a second conductive type opposite to that of the minority carriers of the FinFET. Source/drain are disposed at both sides of the channel 113 and in some embodiments, slightly overlapped (not shown in FIG. 2A) under a sidewall spacer 109' of the metal gate 109. Although not depicted in FIGS. 2A and 2B, it should be understood that a raised source/drain can be implemented in the present embodiment as a regrowth source/drain technique is within the state of the art with respect to FinFET technology.

The channel 113 is disposed between the source/drain and is doped with a first conductive type dopants. Since FinFET is one of the thin-body FET, a doped channel can be identified by a thickness T less than about 50 nm, measured from the top surface 103A of the semiconductor fin 103. In some embodiments, a concentration of the first conductive type dopants in the channel 113 is greater than about $1E15/cm^3$ in order to achieve an effective threshold voltage tuning result. A metal gate 109 is positioned over the channel 113 and having a work function setting layer 109A configured to set a particular work function considering the conductive type of the channel dopants, as well as the dopant concentration. In some embodiments, a gate dielectric 109B can be positioned between the channel 113 and the work function setting layer 109A. Referring to FIG. 2B, the channel 113 with first conductive type implant is located under the top surface 103A and sidewall 103B of the semiconductor fin 103, respectively, possessing a thickness of less than about 50 nm.

For example, if the first conductive type is N type and the second conductive type is P type, the multiple threshold voltage FinFET of FIGS. 2A and 2B represents an NMOSFET having an N-doped channel and a P work function setting layer. Note in the proposed multiple threshold voltage FinFET of the present disclosure, the doped channel and the work function setting layer are having different conductive types.

Referring to FIG. 3A and FIG. 3B, two cross sectional views of a MG FinFET structure are shown. Relations of the cross sections shown in FIG. 3A and FIG. 3B with the perspective view in FIG. 1 are addressed in previous paragraph and is not repeated here. Elements with the same numeral labels in FIGS. 3A, 3B and those in FIGS. 1, 2A, 2B are directed to the same structure of materials, and are not repeated here for simplicity. In FIG. 3A and FIG. 3B, the channel 113 is disposed between the source/drain and is doped with a second conductive type dopants.

The channel 113' is disposed between the source/drain and is doped with second conductive type dopants. Since FinFET is one of the thin-body FET, a doped channel can be identified by a thickness T' less than about 50 nm under the top surface 103A of the semiconductor fin 103. In some embodiments, a concentration of the second conductive type dopants in the channel 113 is greater than about $1E15/cm^3$ in order to achieve an effective threshold voltage tuning result. A metal gate 109 is positioned over the channel 113' and having a work function setting layer 109A' of a first conductive type configured to set a particular work function considering the conductive type of the channel dopants, as well as the dopant concentration. In some embodiments, a gate dielectric 109B can be positioned between the channel 113' and the work function setting layer 109A'. Note the work function setting layer 109A of the second conductive type is disposed over the work function setting layer 109A' of the first conductive type. The effective work function for the FinFET of FIG. 3A is closer to that of the work function setting layer 109A' of the first conductive type. However, in other embodiments, the overlaid work function setting layer 109A of the second conductive type is removed by an additional operation. Referring to FIG. 3B, the channel 113 with second conductive type implant is located under the top surface 103A and sidewall 103B of the semiconductor fin 103, respectively, possessing a thickness of less than about 50 nm.

For example, if the first conductive type is N type and the second conductive type is P type, the multiple threshold voltage FinFET of FIGS. 3A and 3B represents a PMOSFET having a P-doped channel and an N work function setting layer. Note in the proposed multiple threshold voltage FinFET of the present disclosure, the doped channel and the work function setting layer are having different conductive types.

In some embodiments, the metal gates 109 shown in FIG. 2A and FIG. 3A include gate stacks having a work function setting layer 109A and 109A', respectively. The gate stacks include work function setting layers with different conductive types. The work function setting layers include an n-type work function material or a p-type work function material. The n-type work function material includes Ti, Ag, Al, TiAlN, TaC, TaCN, TaSiN, Mn, Zr, other suitable n-type work function materials, or combinations thereof. The p-type work function material includes TiN, TaN, Ru, Mo, Al, WN, other suitable p-type work function materials, or combinations thereof. A work function value is associated with the material composition of the work function setting layer, and thus, the work function setting layer of each gate stack is chosen to tune its work function value so that a desired threshold voltage Vt is achieved in each device region. For example, in the present embodiment, gate stack in FIG. 3A includes an n-type work function material that is selected to achieve a standard threshold voltage (STV) for a P-FinFET device, and gate stack in FIG. 2A includes a p-type work function material that is selected to achieve a standard threshold voltage (STV) for an N-FinFET device.

In some embodiments, the P-FinFET device and the N-FinFET device are formed on a same substrate. The work function of the work function setting layer 109A in N-FinFET of FIG. 2A is greater than that of the work function setting layer 109A' in P-FinFET of FIG. 3A. For example, the work function setting layer 109A has a work function 5% greater than the work function setting layer 109A'. In some embodiments, the work function setting layer 109A includes P-type work function materials, and the work function setting layer 109A' includes N-type work function materials. In the present disclosure, the work function of the work function setting layers 109A, 109A' are both in a range of from about 3.8 eV to about 5.5 eV.

Figure 4:
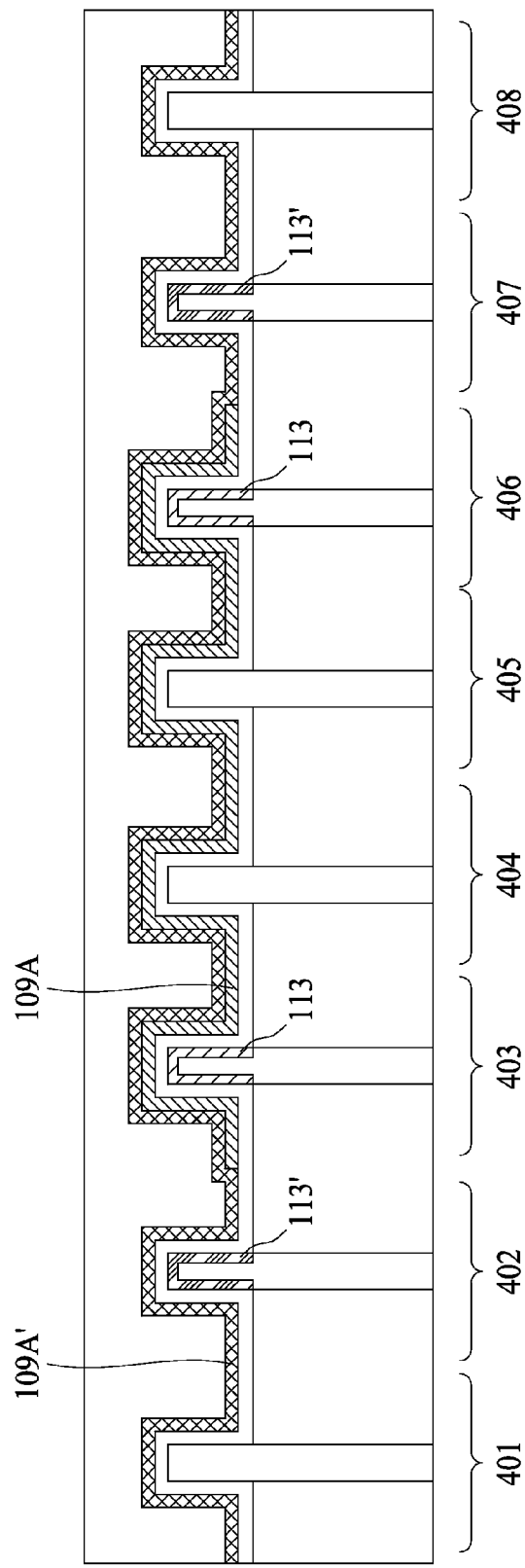
FIG. 4 is a cross sectional view of a of a multiple threshold voltage (Vt) FinFET structure along line BB' in FIG. 1, according to some embodiments of the present disclosure.

Referring to FIG. 4, a series of 8 FinFETs with different threshold voltages are shown. In some embodiments, the 8

FinFETs are formed under a two implantation operations and two work function setting layer deposition operations, as will be addressed in FIG. 15A to FIG. 21 of the present disclosure. For example, FinFET 401 is an uLVT NFET without any channel implant and with an N work function setting layer 109A'. FinFET 402 is a LVT NFET with a P-type impurity channel implant and with an N work function setting layer 109A'. The P-type impurity channel implant may apply column III elements such as B, In, and BF$_2$. FinFET 403 is a SVT NFET with an N-type impurity channel implant and with a P work function setting layer 109A closer to the channel, compared to the position of the overlaid N work function setting layer 109A'. FinFET 404 is an HVT NFET without any channel implant and with a P work function setting layer 109A closer to the channel FinFET 405 is an uLVT PFET without any channel implant and with a P work function setting layer 109A closer to the channel FinFET 406 is a LVT PFET with an N-type impurity channel implant and with a P work function setting layer 109A closer to the channel. The N-type impurity channel implant may apply column V elements such as P and As. FinFET 407 is an SVT PFET with a P-type impurity channel implant and with an N work function setting layer 109A'. FinFET 408 is an HVT PFET without any channel implant and with an N work function setting layer 109A'.

Referring to FIG. 5, a spread table of the conductive type for threshold voltage implantation and conductive type of work function setting layer for a multiple threshold voltage (Vt) FET structure are shown. WF-1 refers to a work function setting layer of a first conductive type. WF-2 refers to a work function setting layer of a second conductive type. In the present disclosure, work function setting layer of a first conductive type has a work function value smaller than that of the work function setting layer of a second conductive type. In other words, the work function setting layer of a first conductive type can be composed of N-work function materials, and the work function setting layer of a second conductive type can be composed of P-work function materials. However, the above is not a limitation to the present disclosure, WF-1 and WF-2 can be made of work function materials of the same conductive type, as long as the work function value of WF-1 is smaller than that of WF-2. In some embodiments, WF-1 may be referred to a combination of materials that produce an effective work function. The combination of materials can be uniformly mixed or demonstrated as a stack with various layers of materials. The same applies to WF-2. Note for NMOS and PMOS having uLVT and HVT, no channel implant is applied. For NMOS, WF-1 and P channel implant is combined to achieve a device with LVT. WF-2 and N channel implant is combined to achieve a device with SVT. For PMOS, WF-2 and N channel implant is combined to achieve a device with LVT. WF-1 and P channel implant is combined to achieve a device with SVT. When WF-1 is an N work function material and WF-2 is a P work function material, NMOS with LVT and NMOS with SVT possess a mixed conductive type work function setting layer and channel implant. Similarly, PMOS with LVT and PMOS with SVT possess a mixed conductive type work function setting layer and channel implant.

Figure 6:
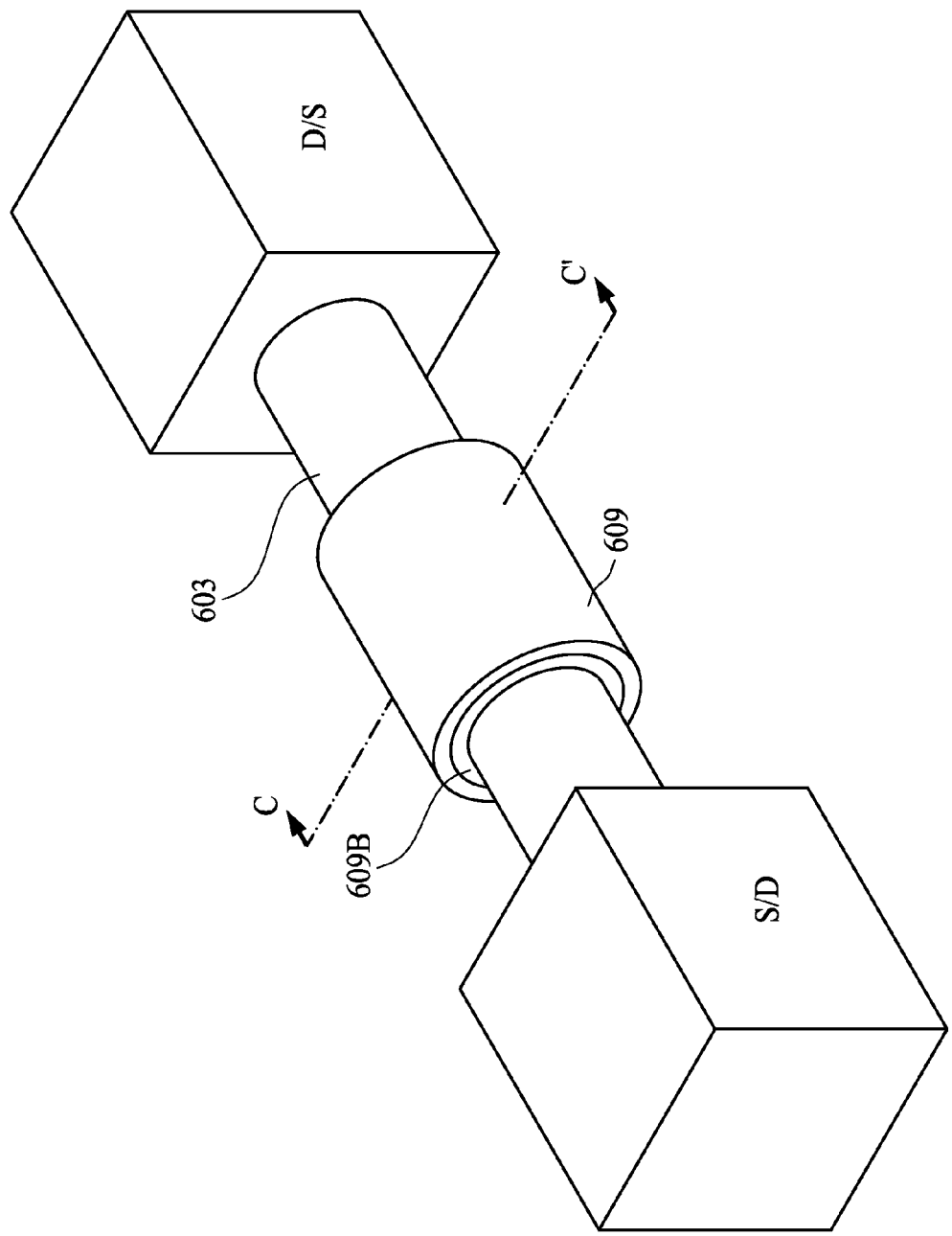
FIG. 6 is a perspective view of a nanowire FET with a tuned threshold voltage, according to some embodiments of the present disclosure.

Referring to FIG. 6, FIG. 6 is a Gate-all-around (GAA) nanowire channel field-effect transistors (NW-FETs). NW-FETs may enable feature scaling beyond current planar complementary-metal-oxide semiconductor (CMOS) technology. Nanowire channel FETs may also be of interest due to their electrostatics, which may be superior to those of conventional FET devices. The fabrication of nanowire channel FETs may include generating a collection of nanowires and placing them where desired (e.g., a bottom-up approach) or may include various lithographic patterning procedures (e.g., a top-down approach). As shown in FIG. 6, a schematic view of the nanowire and source/drain is depicted. Nanowire 603 connects source/drain regions and is wrapped by a gate dielectric 609B and a gate 609. Cross sections along line CC' are further provided in FIG. 7. For example, the channel in proximity to the surface of the nanowire 603 of the first conductive type possesses a thickness of less than about 50 nm.

Figure 7:
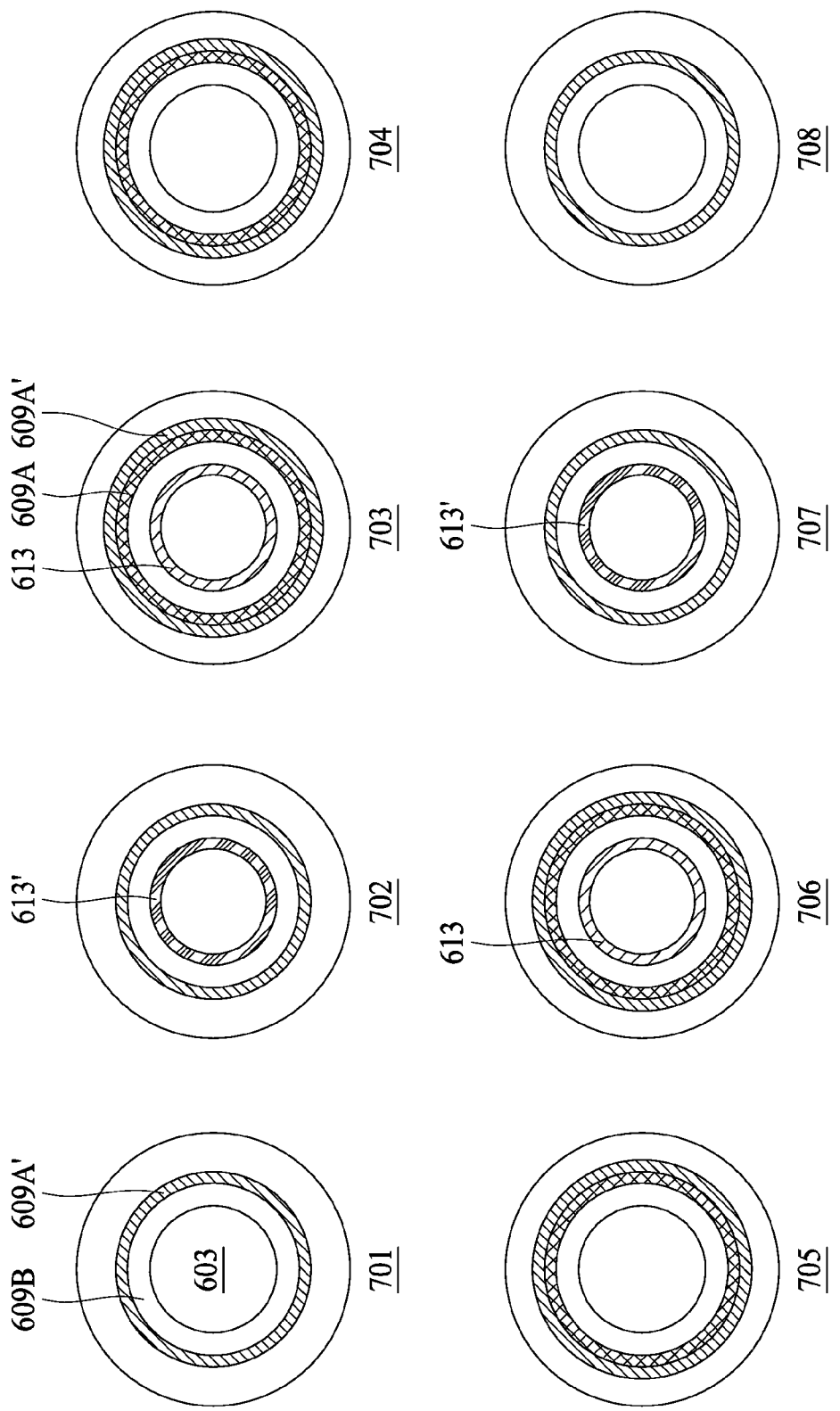
FIG. 7 shows cross sectional views of a channel region of the nanowire FET in FIG. 6 with different threshold voltages, according to some embodiments of the present disclosure.

In FIG. 7, a series of 8 NW-FETs with different threshold voltages are shown. In some embodiments, the 8 NW-FETs are formed under two implantation operations and two work function setting layer deposition operations. For example, NW-FETs 701 is an uLVT NFET without any channel implant and with an N work function setting layer 609A'. FinFET 702 is a LVT NFET with a P-type impurity channel implant 613' and with an N work function setting layer 609A'. FinFET 703 is a SVT NFET with an N-type impurity channel implant 613 and with a P work function setting layer 609A closer to the channel, compared to the position of the overlaid N work function setting layer 609A'. FinFET 704 is an HVT NFET without any channel implant and with a P work function setting layer 609A closer to the channel FinFET 705 is an uLVT PFET without any channel implant and with a P work function setting layer 609A closer to the channel FinFET 706 is a LVT PFET with an N-type impurity channel implant 613 and with a P work function setting layer 609A closer to the channel FinFET 707 is an SVT PFET with a P-type impurity channel implant 613' and with an N work function setting layer 609A'. FinFET 708 is an HVT PFET without any channel implant and with an N work function setting layer 609A'.

In addition to FinFETs and NW-FETs, CMOS with planar geometry can also be implemented with the structure presented herein to tune the threshold voltage. The efficacy of the traditional approach for enhancing the performance of NMOS and PMOS devices may be improved by additionally customizing the transistor channel materials and their respective strain levels selectively for NMOS and PMOS devices. This is particularly true for advanced transistor geometries such as partially depleted semiconductor-on-insulator (PDSOI) devices or fully depleted semiconductor-on-insulator (FDSOI) devices. Fully depleted planar SOI devices are particularly attractive as an alternative to conventional planar bulk CMOS devices because improved gate control with thin Si films and two gates enables aggressive scaling of the device dimensions without significant penalties in terms of static leakage, short-channel effects or performance degradation. FDSOI devices include metallic gate electrodes in order to achieve the desired threshold voltage Vt.

Figure 8:
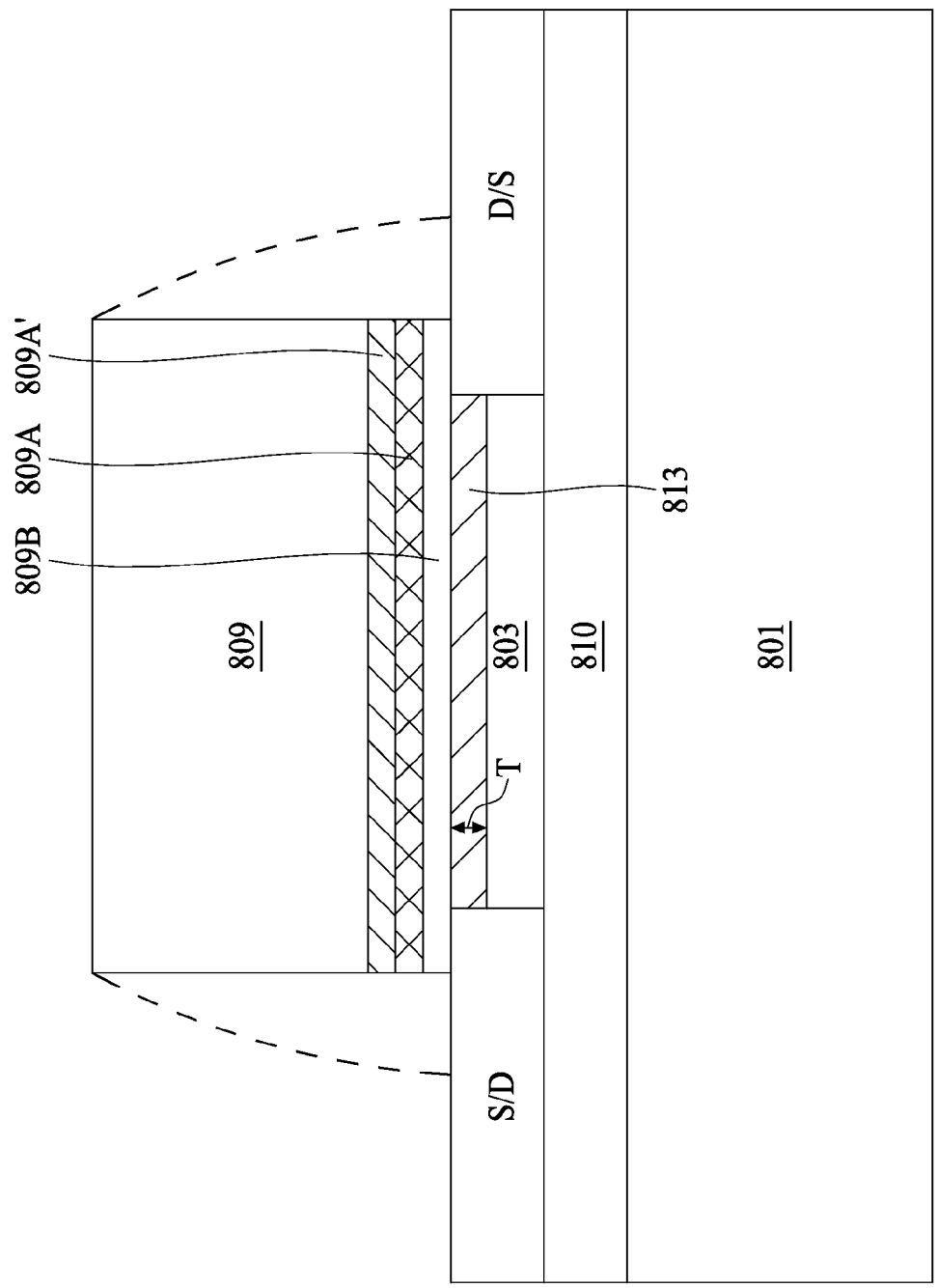
FIG. 8 is a cross sectional view of a fully depleted silicon on insulator (FD-SOI) FET, with a tuned threshold voltage, according to some embodiments of the present disclosure.

Referring to FIG. 8, FIG. 8 is a cross sectional view of an FDSOI field-effect transistor (FDSOI-FET). As shown in FIG. 8, a buried oxide layer 810 is disposed between the substrate 801 and the depleted body 803. A channel 813 of a first conductive type is in proximity to the top surface of the depleted body 803. A work function setting layer 809A of a second conductive type is positioned over a gate electrode 809B. In some embodiments, a work function setting layer 809A' of a first conductive type is positioned over the work function setting layer 809A of a second conductive type. For example, the channel 813 of the first conductive type possesses a thickness of less than about 50 nm.

Figure 9:
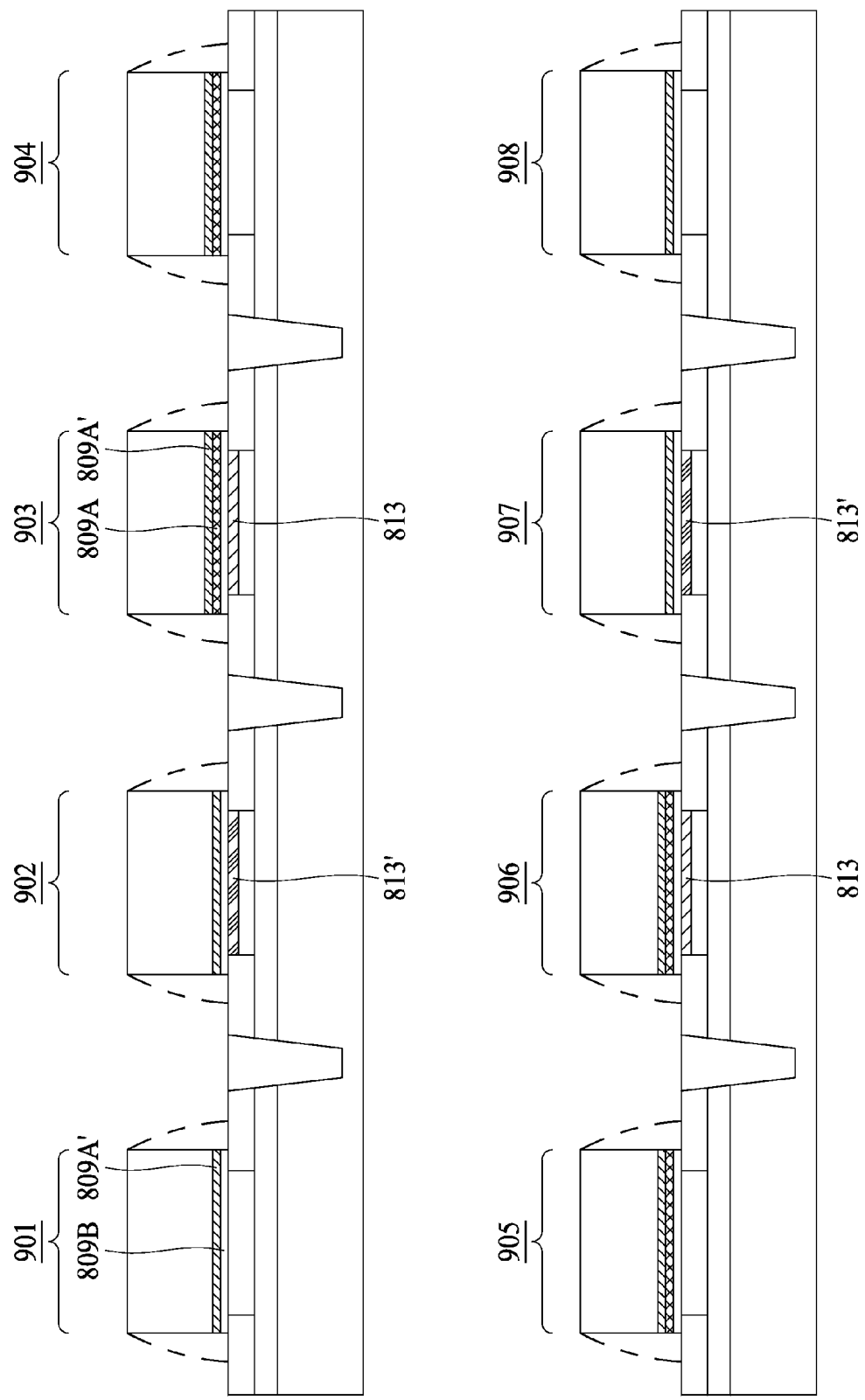
FIG. 9 shows cross sectional views of the FD-SOI FET in FIG. 8 with different threshold voltages, according to some embodiments of the present disclosure.

In FIG. 9, a series of 8 FDSOI-FETs with different threshold voltages are shown. In some embodiments, the 8

NW-FETs are formed under two implantation operations and two work function setting layer deposition operations. For example, FDSOI-FET 901 is an uLVT NFET without any channel implant and with an N work function setting layer 809A'. FDSOI-FET 902 is a LVT NFET with a P-type impurity channel implant 813' and with an N work function setting layer 809A'. FDSOI-FET 903 is a SVT NFET with an N-type impurity channel implant 813 and with a P work function setting layer 809A closer to the channel, compared to the position of the overlaid N work function setting layer 809A'. FDSOI-FET 904 is an HVT NFET without any channel implant and with a P work function setting layer 809A closer to the channel FDSOI-FET 905 is an uLVT PFET without any channel implant and with a P work function setting layer 809A closer to the channel FDSOI-FET 906 is a LVT PFET with an N-type impurity channel implant 813 and with a P work function setting layer 809A closer to the channel FDSOI-FET 907 is an SVT PFET with a P-type impurity channel implant 813' and with an N work function setting layer 809A'. FDSOI-FET 908 is an HVT PFET without any channel implant and with an N work function setting layer 809A'.

Note in FIG. 9, isolation feature 900 is formed in the substrate 801 to isolate various regions, such as FDSOI-FET 901 and FDSOI-FET 902. The isolation feature 900 also isolates the FDSOI-FET 901 and FDSOI-FET 902 from other FDSOI-FETs. The isolation feature 900 utilizes isolation technology, such as local oxidation of silicon (LOCOS) and/or shallow trench isolation (STI), to define and electrically isolate the various regions. The isolation feature 900 comprises silicon oxide, silicon nitride, silicon oxynitride, other suitable materials, or combinations thereof. The isolation feature 900 is formed by any suitable process. As one example, forming an STI includes a photolithography process, etching a trench in the substrate (for example, by using a dry etching and/or wet etching), and filling the trench (for example, by using a chemical vapor deposition process) with one or more dielectric materials. For example, the filled trench may have a multi-layer structure such as a thermal oxide liner layer filled with silicon nitride or silicon oxide. In another example, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

FIG. 10 to FIG. 14 show fragmental cross sectional views of a "gate-last" operation implemented on a FinFET. In other embodiments, a "gate-first" operation is implemented in the manufacturing process of the present disclosure. In some embodiments, the "gate last" operation allows for reduced number of subsequent processes, including high temperature processing, that must be performed after formation of the gate.

Figure 10:
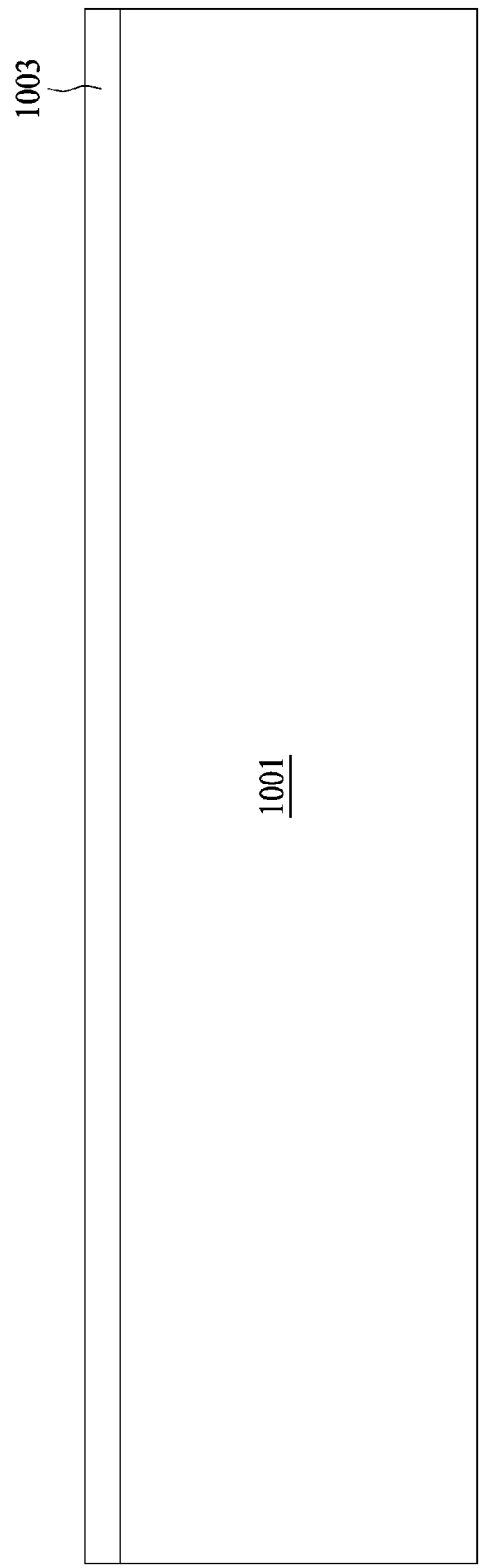
FIG. 10 to FIG. 14 show fragmental cross sectional views of a gate-last operation of a FinFET, according to some embodiments of the present disclosure.

In FIG. 10, according to some embodiments of present disclosure, semiconductor fin 1001 is formed over a semiconductor substrate (not shown). A sacrificial dielectric layer 1003 is formed on the semiconductor fin 1001. In some embodiments, the sacrificial dielectric layer 1003 is optional. In some embodiments, the sacrificial dielectric layer 1003 includes an oxide formed either by thermal or chemical vapor deposition. In some embodiments, the sacrificial dielectric layer 1003 is formed in a single wafer chamber equipment. In other embodiments, the sacrificial dielectric layer 1003 is formed in a furnace using a batch mode.

Figure 11:
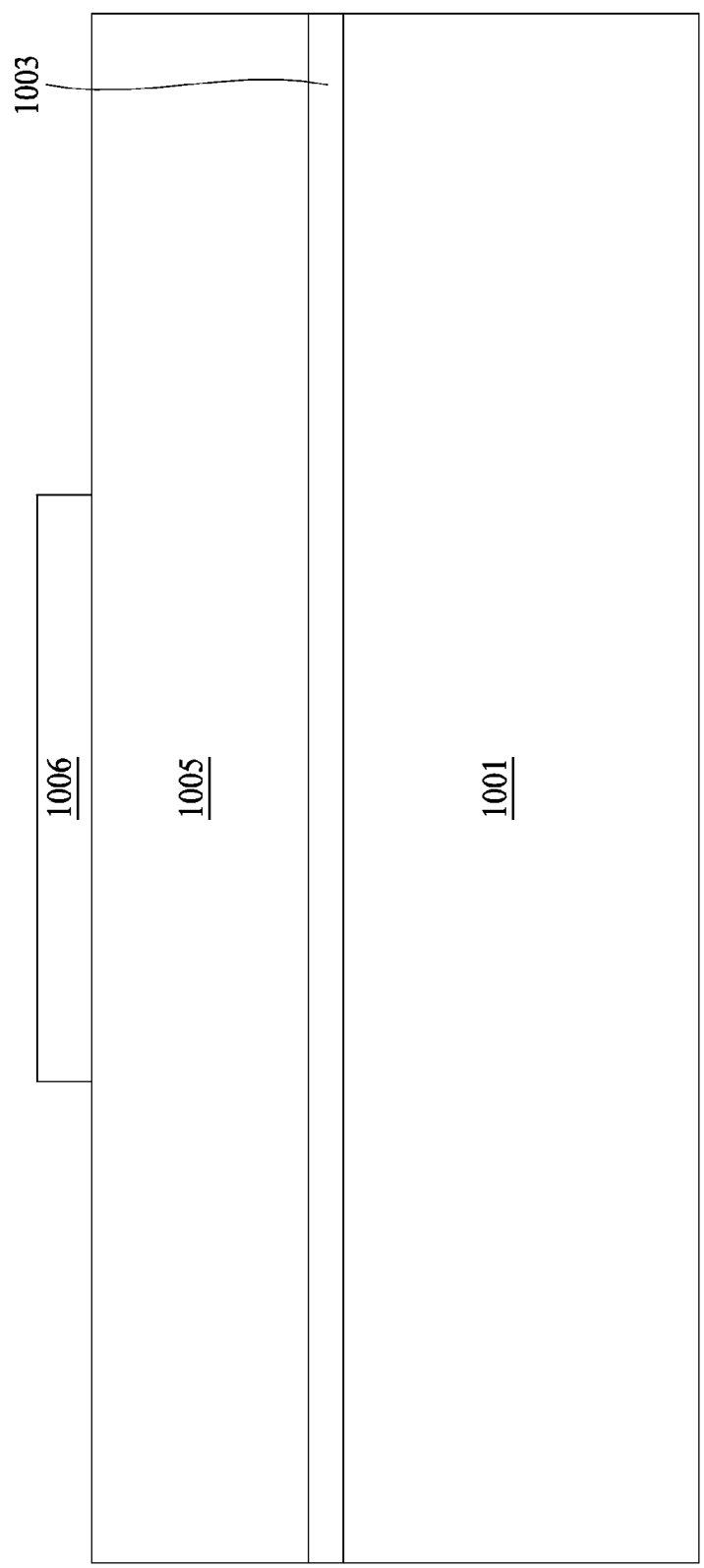

In FIG. 11, a dummy gate 1005 is formed over the sacrificial dielectric layer 1003. In some embodiments, the dummy gate 1005 is formed by physical vapor deposition, chemical vapor deposition (CVD), or other suitable deposition operation. In some embodiments, silane ($SiH_4$), di-silane ($Si_2H_6$), or di-chlorosilane ($SiCl_2H_4$) may be used in a CVD operation to form the dummy gate 1005. The dummy gate 1205 may include a thickness ranging from about 150Å to about 2500Å.

Figure 12:
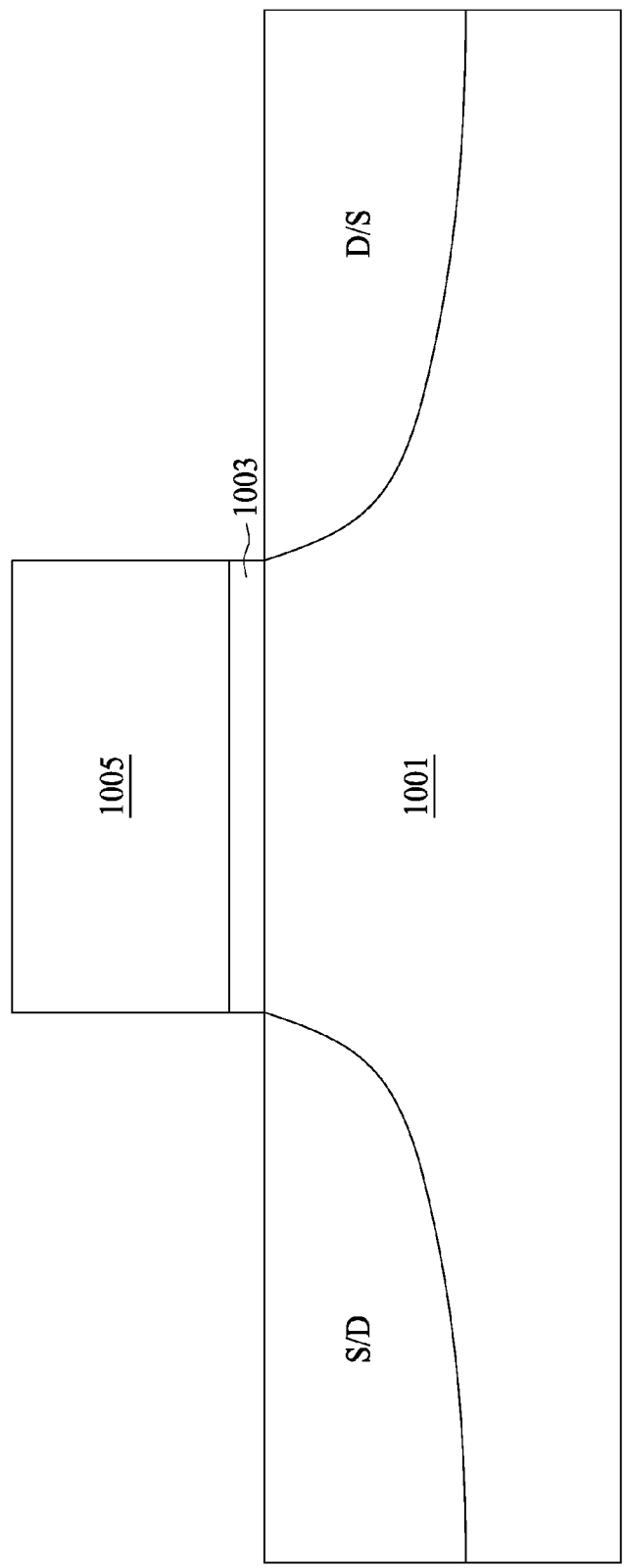

Referring to FIG. 11 and FIG. 12, a hard mask layer 1006 is patterned over the dummy gate 1005 and the pattern is transferred to the underlying dummy gate 1005 and the optional sacrificial dielectric layer 1003. In some embodiments, the hard mask layer 1006 includes silicon nitride, silicon oxynitride, silicon carbide, and/or other suitable dielectric materials, and may be formed using a method such as chemical vapor deposition (CVD) or physical vapor deposition (PVD or sputtering). The hard mask layer 1006 includes a thickness between about 100 and about 400 Å. In some embodiments, an antireflective coating layer (ARC) is formed on the hard mask layer to enhance a photolithography process for patterning a photoresist layer. For example, a patterned photoresist layer (not shown) may be formed on the hard mask layer 1006. The pattern of the hard mask layer 1006 is then transferred to the dummy gate 1001 by a dry etch, a wet etch, or the combinations thereof.

Figure 13:
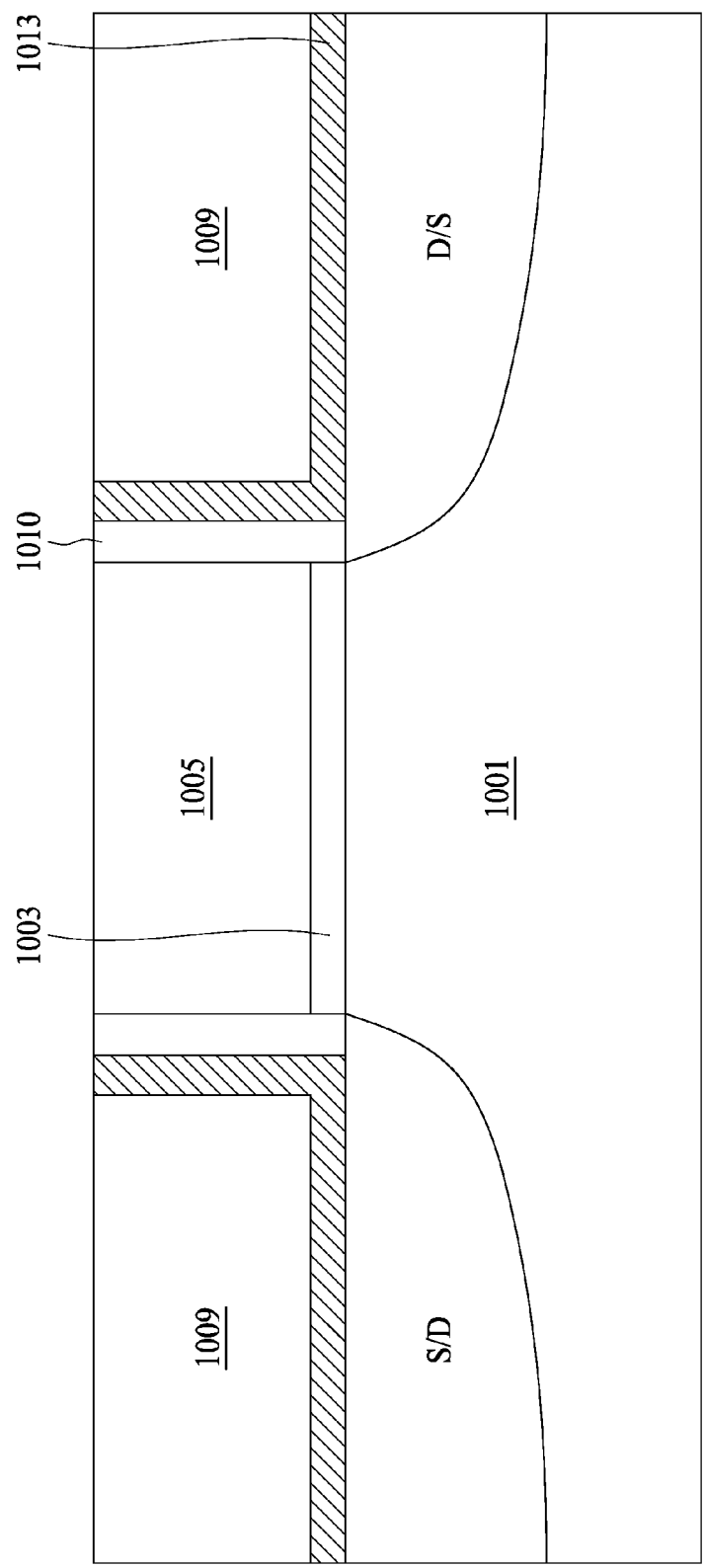

In FIG. 13, sidewall spacers 1010, nitride layers 1013, and an interlayer dielectric (ILD) 1009 are formed. It is understood that the ILD 1009 may include one or more dielectric materials and/or one or more dielectric layers. The materials used for ILD 1009 is discussed previously referring to FIG. 1 and is not repeated here for simplicity. In some embodiments, the ILD 1009 is planarized by a chemical-mechanical-polishing (CMP) process until a top portion of the dummy gate 1005 is exposed as illustrated in FIG. 13.

Figure 14:
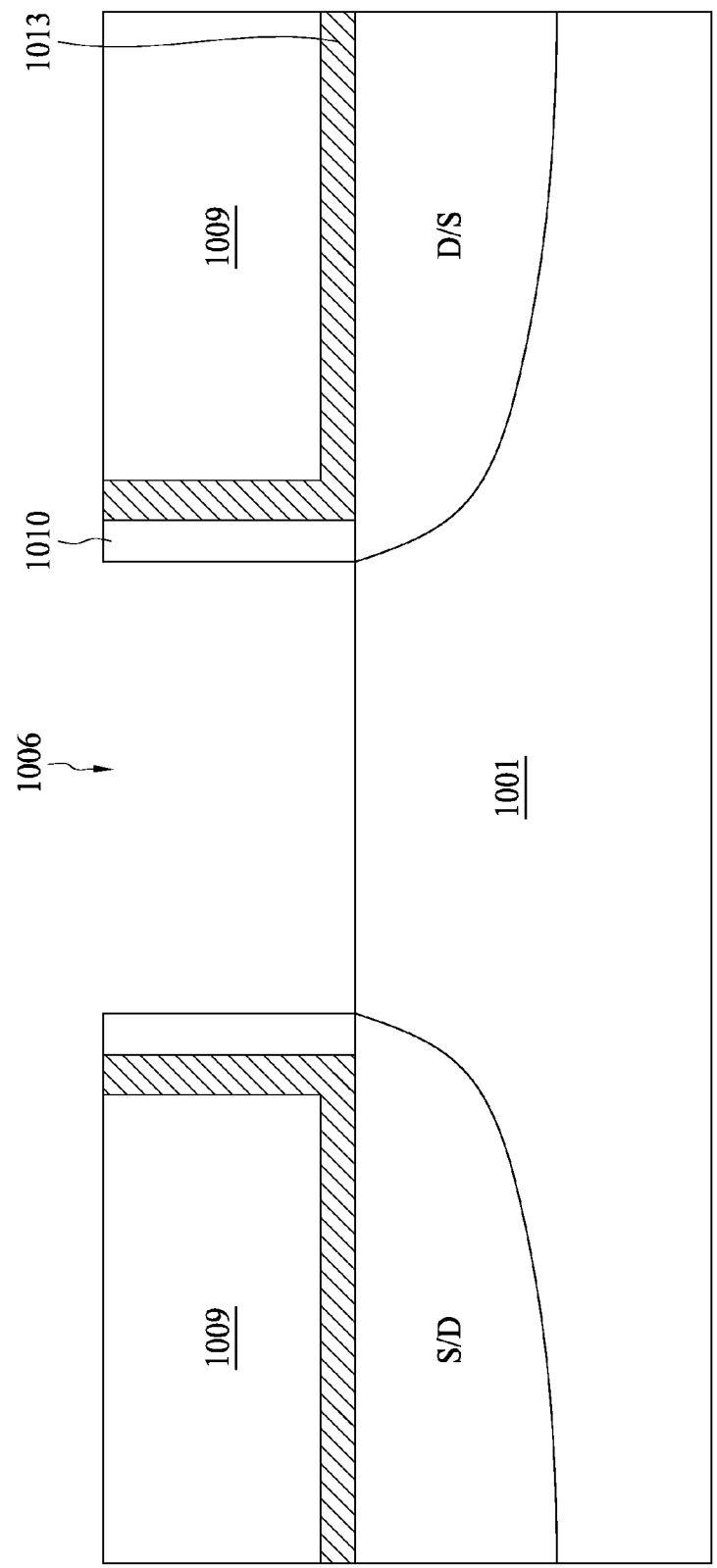

In FIG. 14, a gate replacement process is performed. The dummy gate 1005 and the sacrificial dielectric layer 1003 are removed by a dry etch, wet etch, combination dry and wet etch, or other suitable process. In some embodiments, the dummy gate 1005 and sacrificial dielectric layer 1003 are removed in a single-step etching process or multiple-step etching process. For example, a first wet etch process is used to remove the dummy gate 1005. The first wet etch process may include exposure to a hydroxide-containing solution (e.g., ammonium hydroxide), de-ionized water, and/or other suitable etchant solutions. A second wet etch process is used to remove the sacrificial dielectric layer 1003. The second wet etch process includes exposure to a buffered HF solution or a buffered oxide etchant (BOE). The second wet etch process may selectively remove the sacrificial dielectric layer 1003 and stops at the semiconductor fin 1001, thereby forming a trench 1006 in the metal gate structure. It is understood that other etching chemicals may be used for selectively removing the sacrificial dielectric layer 1003 and dummy gate 1005.

Figure 15:
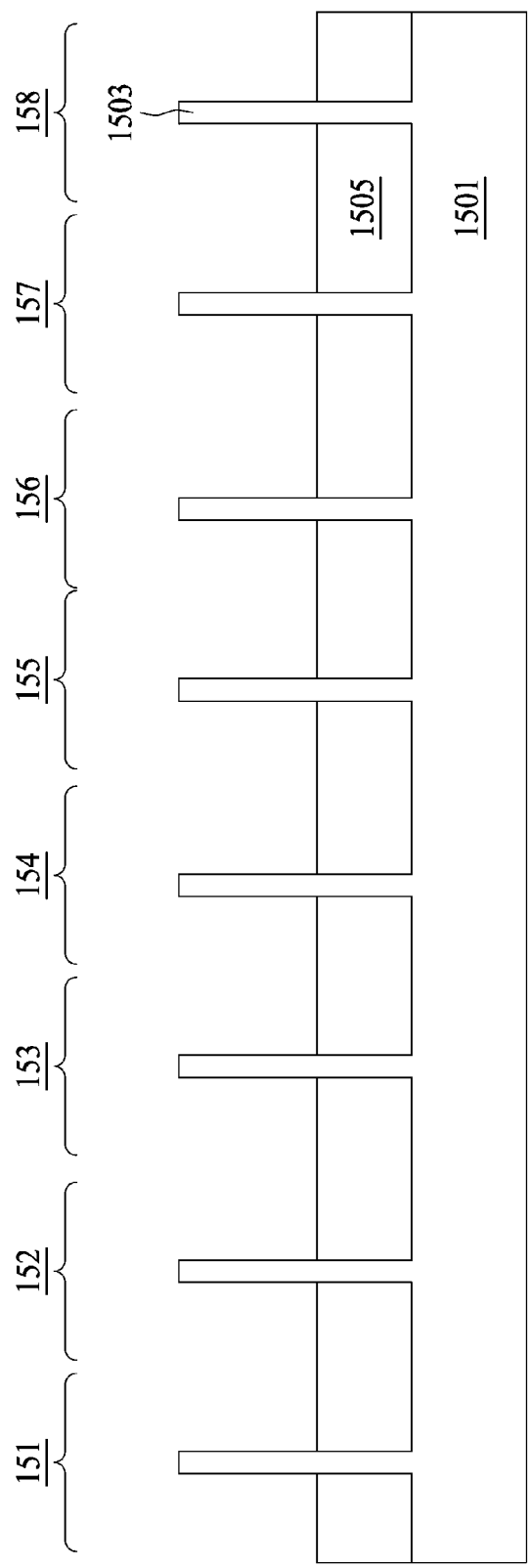
FIG. 15 to FIG. 21 show fragmental cross sectional views of the formation of a multiple threshold voltage FinFET structure with N-uLVT, N-LVT, N-SVT, N-HVT, P-uLVT, P-LVT, P-SVT, P-HVT transistors by two implantation operations and two work function setting layer deposition operations, according to some embodiments of the present disclosure.

FIG. 15 to FIG. 21 show fragmental cross sectional views of the formation of a multiple threshold voltage FinFET structure with N-uLVT 151, N-LVT 152, N-SVT 153, N-HVT 154, P-uLVT 155, P-LVT 156, P-SVT 157, P-HVT 158 transistors by two implantation operations and two work function setting layer deposition operations, according to some embodiments of the present disclosure. In FIG. 15, a cross section dissecting along line BB' of FIG. 1 is shown. In a "gate-last" operation scheme, FIG. 15 shows a fragmental cross section after the gate replacement operation as shown in FIG. 14. For example, a total 8 FinFETs operated under different threshold voltages are illustrated in FIG. 15. The bottom of the semiconductor fin 1503 is connected with the substrate 1501, and the adjacent fins are isolated from each other by the dielectric layer 1505 partially filled between the lower portion of the semiconductor fins 1503.

Figure 16:
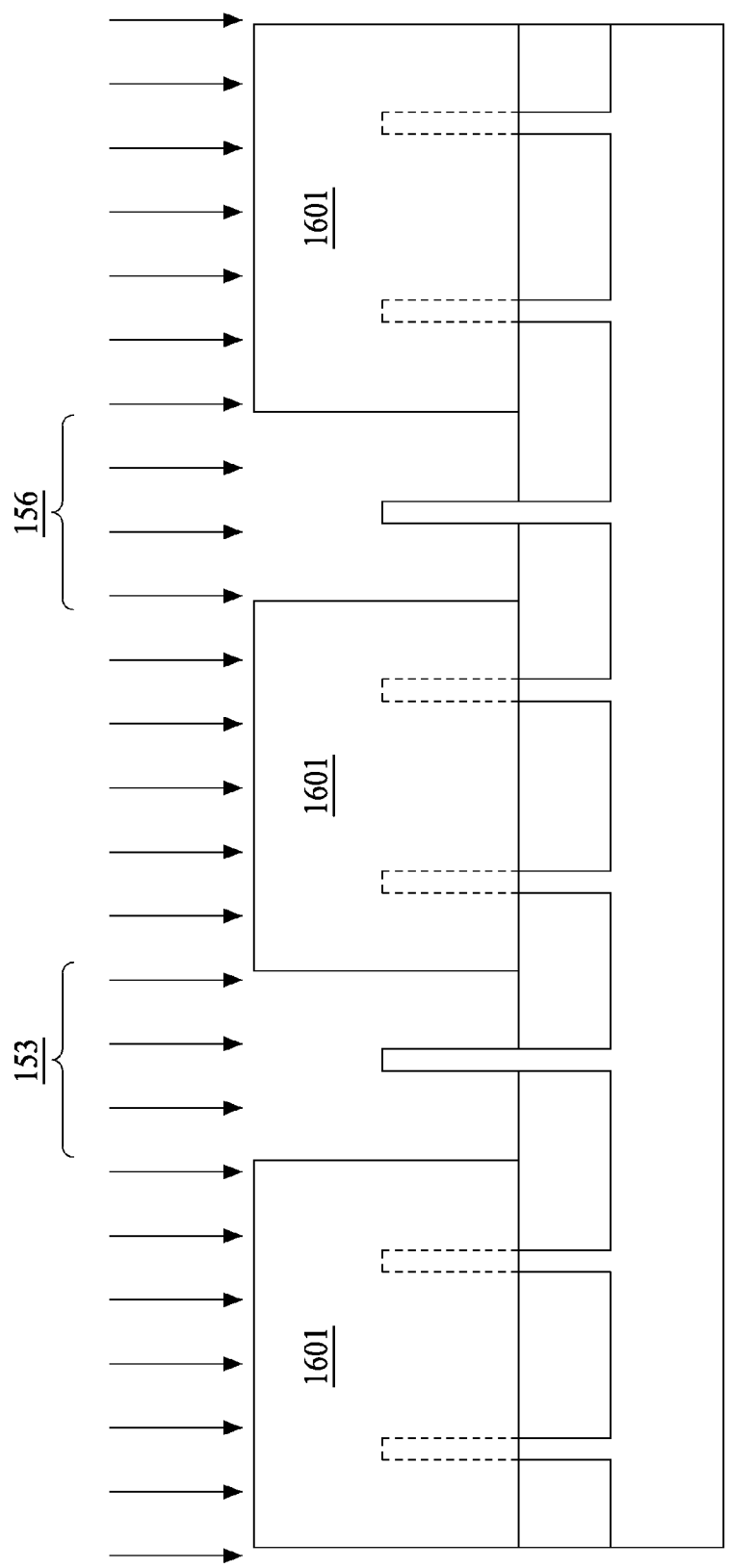
Figure 17:
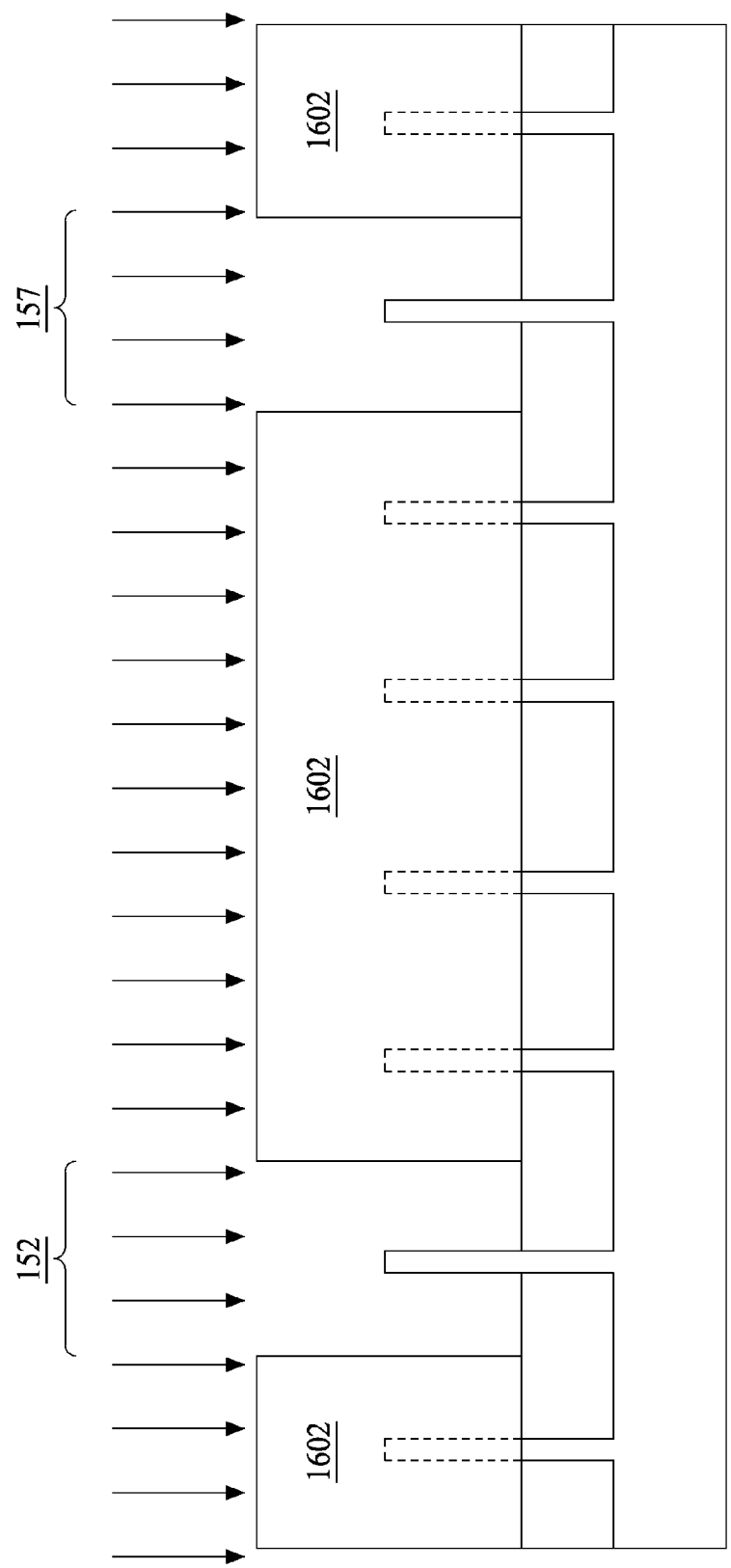

In FIG. 16, a first mask 1601 for a first implant operation is formed over the semiconductor fins 1503, exposing only the FinFETs with N-SVT 153 (i.e., a first transistor of a first conductive type) and P-LVT 156 (i.e., a first transistor of a second conductive type). In some embodiments, the two exposed FinFETs possess a substantial identical concentration of dopants at the channel having a first conductive type since a substantial identical implantation dose is applied. For example, an N dopant having a dopant concentration more than about $1E15/cm^3$ at the channel. In some embodiments, the implantation dose is more than about $1E11/cm^2$ for the current channel implant operation. In FIG. 17, a second mask 1602 for a second implant operation is formed over the semiconductor fins 1503, exposing only the FinFETs with N-LVT 152 (i.e., a second transistor of a first conductive type) and P-SVT 157 (i.e., a second transistor of a second conductive type). In some embodiments, the two exposed FinFETs possess a substantial identical concentration of dopants at the channel having a second conductive type since a substantial identical implantation dose is applied. For example, a P dopant having a dopant concentration more than about $1E15/cm^3$ at the channel. In some embodiments, the implantation dose is more than about $1E11/cm^2$ for the current channel implant operation. It is understood that the channel implant operations addressed above can be performed with a tilting angle in order to uniformly dope the top surface and sidewall of the semiconductor fins 1503. In some embodiments, forming a doped channel with dopant concentration more than about $1E15/cm^3$ from a top surface of the semiconductor fin 1503 to a depth less than about 50 nm of the semiconductor fin 1503 may require a dopant energy lower than 100 KeV.

Figure 18:
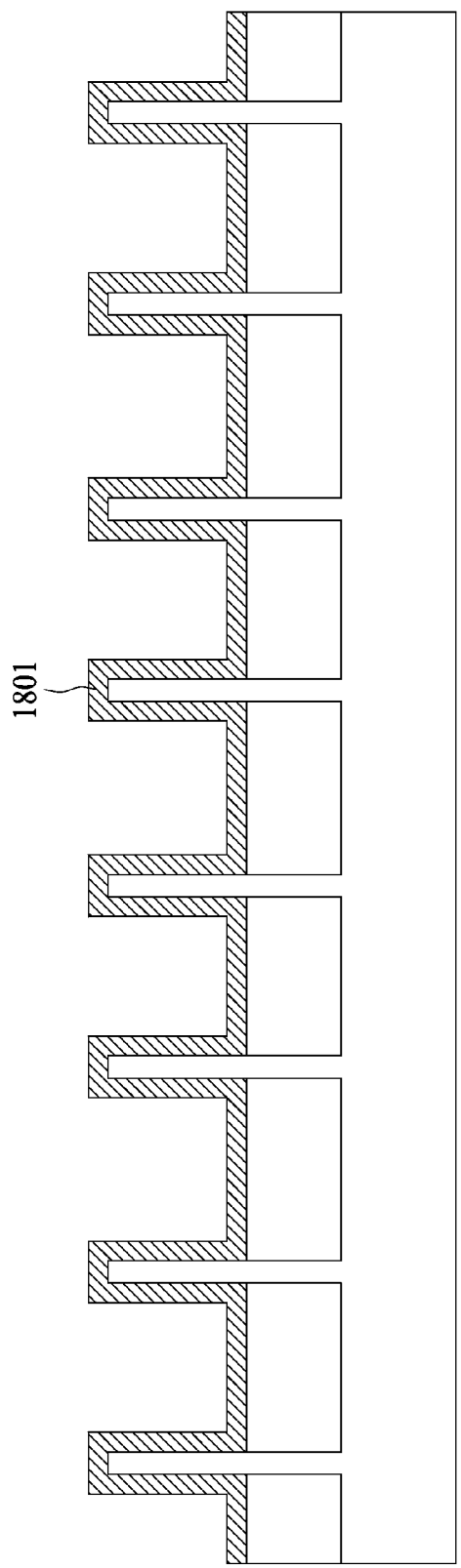
Figure 19:
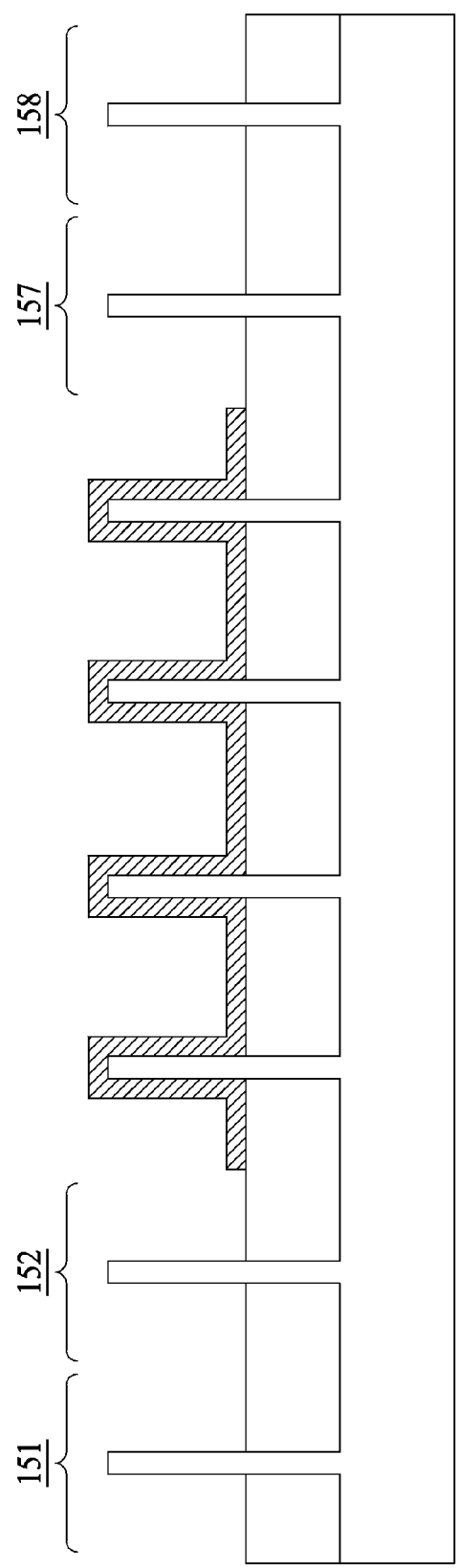
Figure 20:
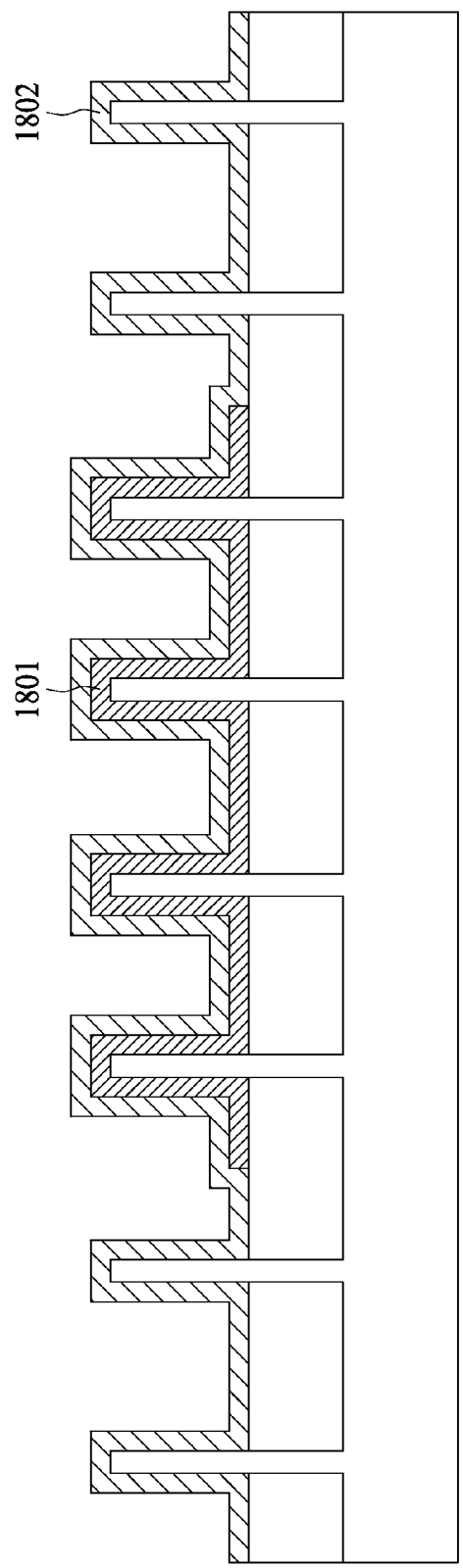
Figure 21:
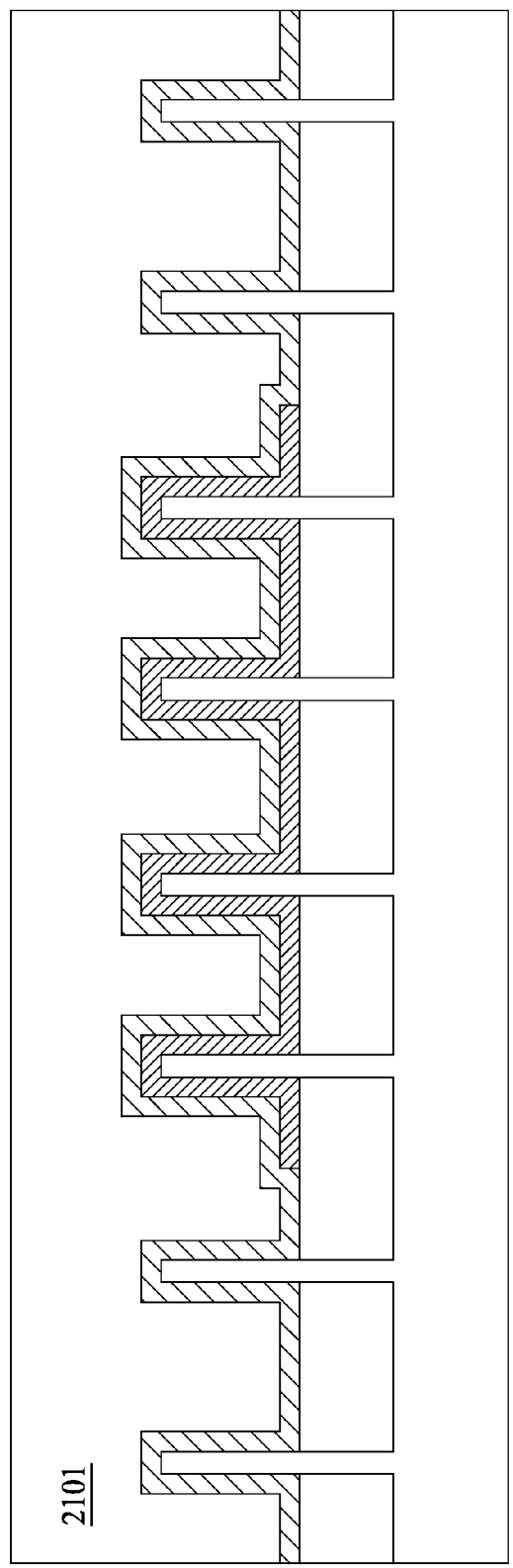

In FIG. 18, a work function setting layer 1801 of a second conductive type is blanket deposited over all 8 FinFETs. The work function setting layer 1801 covers the doped channel of the first conductive type (N-SVT 153, P-LVT 156), the second conductive type (N-LVT 152, P-SVT 157), and other undoped channels (N-uLVT 151, N-HVT 154, P-uLVT 155, P-HVT 158, i.e., the third and the fourth transistors of the first conductive type, the third and the fourth transistors of the second conductive type). In FIG. 19, the work function setting layer 1801 is removed from the N-uLVT 151, N-LVT 152, P-SVT 157, and P-HVT 158 (i.e., the second and the third transistors of the first conductive type, the second and the third transistors of the second conductive type). In FIG. 20, a work function setting layer 1802 of a first conductive type is blanket deposited over all 8 FinFETs, and hence some of the FinFETs (N-SVT 153, N-HVT 154, P-uLVT 155, P-LVT 156) include two layers of work function setting layer 1801, 1802. In some embodiments, the subsequently deposited work function setting layer 1802 can be removed by an additional etching operation (not shown) from some of the FinFETs (for example, N-SVT 153, N-HVT 154, P-uLVT 155, P-LVT 156). For example, each work function setting layer 1801, 1802 can possesses a thickness from about 0.1 nm to about 50 nm, depending on various design factors that affect final threshold voltages. In FIG. 21, a filling metal 2101 is formed over all 8 FinFETs, including the first to the fourth transistors of the first conductive type, and the first to the fourth transistors of the second conductive type.

In addition to the work function setting layers 1801, 1802 and the filling metal, the gate stack can include other material layers, such as interfacial layers, gate dielectric layers, high-k gate dielectric layers, capping layers, adhesion layers, barrier layers, wetting layers, other suitable layers, and/or combinations thereof. The work function setting layer and other material layers of the gate stack are formed by deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, or ion-beam writing. The etching processes include dry etching, wet etching, and/or other etching methods.

The integrated circuit device may undergo further CMOS or MOS technology processing to form various features known in the art. For example, one or more contact features (not shown), such as silicide regions, may also be formed. The contact features may be coupled to the source and drain. The contact features comprise silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In an example, the contact features are formed by a salicide (self-aligned silicide) process.

Subsequent processing may further include forming various contacts/vias/lines and multilayer interconnect features (e.g., metal layers and interlayer dielectrics) over the substrate, configured to connect the various features or structures of the integrated circuit device 200. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

The multiple threshold voltage FET structure provided in the present disclosure can be implemented in any portable IOT devices in various applications such as media, environmental monitoring, infrastructure management, energy management, medical and healthcare systems, building, industrial and home monitoring and automation, transportation, large scale deployments and the like.

The present disclosure provides an FET structure including a transistor of a first conductive type. The transistor includes a substrate having a region of a second conductive type, a source and a drain of the first conductive type, a channel between the source and the drain, comprising dopants of the first conductive type; and a gate over the channel, comprising a work function setting layer of the second conductive type.

The present disclosure provides a method of setting multi-threshold voltages for FET structures. The method includes forming a lower threshold voltage ($V_t$) transistor of a first conductive type by implanting a channel of the lower $V_t$ transistor of the first conductive type with dopants of the first conductive type, and depositing a work function setting layer of a second conductive type, covering the channel of the lower $V_t$ transistor of the first conductive type.

The present disclosure provides a method of manufacturing an FET with multi-threshold voltages. The method includes exposing a channel of a first transistor of a first conductive type and a channel of a first transistor of a second conductive type from a first mask, doping the channel of the first transistor of the first conductive type and the channel of the first transistor of a second conductive type with dopants of the first conductive type at a substantial identical implantation dose, exposing a channel of a second transistor of a first conductive type and a second transistor of a second conductive type from a second mask, doping the channel of the second transistor of the first conductive type and the channel of the second transistor of a second conductive type with dopants of the second conductive type at a substantial identical implantation dose, and depositing a work function setting layer of the second conductive type over the first transistor of the first conductive type and the first transistor of a second conductive type.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a field effect transistor (FET) with multi-threshold voltages, comprising:
   exposing a channel of a first transistor of a first conductive type and a channel of a first transistor of a second conductive type from a first mask;
   doping the channel of the first transistor of the first conductive type and the channel of the first transistor of the second conductive type with dopants of the first conductive type at a substantial identical implantation dose;
   exposing a channel of a second transistor of the first conductive type and a second transistor of the second conductive type from a second mask;
   doping the channel of the second transistor of the first conductive type and the channel of the second transistor of the second conductive type with dopants of the second conductive type at a substantial identical implantation dose;
   depositing a work function setting layer of the second conductive type over the first transistor of the first conductive type and the first transistor of the second conductive type; and
   after depositing the work function setting layer of the second conductive type, depositing a work function setting layer of the first conductive type over the second transistor of the first conductive type and the second transistor of the second conductive type.

2. The method of claim 1, further comprising:
   removing the work function setting layer of the second conductive type from the second transistor of the first conductive type and from the second transistor of the second conductive type; and
   wherein the depositing the work function setting layer of the first conductive type over the second transistor of the first conductive type and the second transistor of the second conductive type includes depositing the work function setting layer of the first conductive type over the work function setting layer of the second conductive type over the first transistor of the first conductive type and the first transistor of a second conductive type.

3. The method of claim 2, further comprising depositing filling metal over the first and second transistors of the first conductive type and over the first and second transistors of the second conductive type.

4. The method of claim 1, further comprising forming a plurality of fins before exposing the channel of the first transistor of the first conductive type and the channel of the first transistor of the second conductive type from the first mask.

5. The method of claim 1, wherein the doping the channel of the first transistor of the first conductive type and the channel of the first transistor of the second conductive type comprises performing an implantation operation below 100 KeV.

6. The method of claim 1, further comprising removing a dummy gate over the channel region of the first transistor of the first conductive type and over the channel region of the first transistor of the second conductive type.

7. A method for manufacturing a semiconductor device, comprising:
   providing channel regions of a first transistor, a second transistor, a third transistor and a fourth transistor, wherein the first and third transistors are of a first conductive type and the second and fourth transistors are of a second conductive type;
   providing a first masking element over the channel regions of the first and second transistors while concurrently implanting the channel regions of the third and fourth transistors;
   removing the first masking element and forming a second masking element over the channel regions of the third and fourth transistors while concurrently implanting the channel regions of the first and second transistors;
   depositing a first work function setting layer of the second conductive type over each of the channel regions of each of the first, second, third, and fourth transistors;
   removing the first work function setting layer from over the channel regions of the first and second transistors; and
   after removing the first work function setting layer, depositing a second work function setting layer of the first conductive type over each of the channel regions of the first and second transistors and depositing the second work function setting layer over the first work function setting layer over the channel regions of the third and fourth transistors.

8. The method of claim 7, further comprising:
forming a metal fill layer over the channel regions of the first, second, third and fourth transistors.

9. The method of claim 8, wherein the metal fill layer physically interfaces the second work function setting layer.

10. The method of claim 7, wherein the providing channel regions of the first transistor, the second transistor, the third transistor and the fourth transistor includes providing a semiconductor fin extending from a semiconductor substrate for each of the first, second, third and fourth transistors.

11. The method of claim 7, wherein the providing the channel region of the first transistor, the second transistor, the third transistor and the fourth transistor includes:
forming a dummy gate structure over a fin associated with each of the first transistor, the second transistor, the third transistor and the fourth transistor;
removing dummy gate structure to form a respective trench over each fin, wherein the channel region of each of the first transistor, the second transistor, the third transistor and the fourth transistor underlies the respective trench.

12. A method, comprising:
providing a plurality of channel regions including a first channel region, a second channel region, a third channel region, and a fourth channel region;
performing a first implantation process implanting the first and third channel regions with a first dopant type;
performing a second implantation process implanting the second and fourth channel regions with a second dopant type;
performing a first deposition process depositing a work function material of a second work function conductivity type over the first and third channel regions; and
after performing the first deposition process, performing a second deposition process depositing a work function material of a first work function conductivity type over the first, second, third and fourth channel regions, wherein the first channel region and the second channel region are associated with N-type field effect transistors and wherein the third channel region and the fourth channel region are associated with P-type field effect transistors.

13. The method of claim 12, further comprising:
wherein performing the first deposition process includes depositing the work function material of the second work function conductivity type over the second and fourth channel regions, and
after the performing the first deposition process and prior to performing the second deposition process, removing the work function material of the second work function conductivity type from over the second and fourth channel regions.

14. The method of claim 12, wherein the providing the plurality of channel regions includes forming each of the first, second, third and fourth channel regions in a fin extending from a substrate.

15. The method of claim 12, wherein the providing the plurality of channel regions further includes providing a fifth channel region and a sixth channel region, wherein the fifth and sixth channel regions are associated with N-type field effect transistors;
wherein the fifth and sixth channel regions are covered by a mask during the first and second implantation processes.

16. The method of claim 15, wherein the performing the first and second deposition processes includes depositing the work function metal of the second work function conductivity type and the work function metal of the first work function conductivity type over the fifth channel region.

17. The method of claim 16, wherein the performing the first and second deposition processes includes depositing the work function metal of the second work function conductivity type and the work function metal of the first work function conductivity type over the sixth channel region, and wherein between the first deposition process and the second deposition process, the work function metal of the second work function conductivity type is removed from the sixth channel region.

18. The method of claim 12, wherein the first channel region is associated with a higher threshold voltage than the second channel region.

19. The method of claim 12, wherein the first implantation process includes implanting the first dopant type comprising implanting N-type dopants at an energy lower than 100 KeV.

20. The method of claim 12, wherein the first deposition process includes depositing the work function material of the second work function conductivity type comprising depositing metal or semiconductor with a thickness of from about 0.1 nm to about 50 nm.

* * * * *